US012651635B2

(12) United States Patent
Kim et al.

(10) Patent No.:　US 12,651,635 B2
(45) Date of Patent:　　Jun. 9, 2026

(54) MEMORY DEVICES SUPPORTING ENHANCED GATE-INDUCED DRAIN LEAKAGE (GIDL) ERASE OPERATION

(71) Applicant: Samsung Electronics Co., Ltd., Suwon-si (KR)

(72) Inventors: Byungsoo Kim, Suwon-si (KR); Yohan Lee, Suwon-si (KR); Hyunggon Kim, Suwon-si (KR); Sang Soo Park, Suwon-si (KR); Bongsoon Lim, Suwon-si (KR); Jin-Young Chun, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 205 days.

(21) Appl. No.: 18/517,429

(22) Filed: Nov. 22, 2023

(65) Prior Publication Data

US 2024/0194269 A1　　Jun. 13, 2024

(30) Foreign Application Priority Data

Dec. 9, 2022　(KR) ........................ 10-2022-0171531

(51) Int. Cl.
*G11C 16/16*　　(2006.01)
*G11C 16/04*　　(2006.01)
(Continued)

(52) U.S. Cl.
CPC .......... *G11C 16/16* (2013.01); *G11C 16/0483* (2013.01); *G11C 16/08* (2013.01);
(Continued)

(58) Field of Classification Search
CPC ..... G11C 16/16; G11C 16/0483; G11C 16/14; G11C 16/24; G11C 16/08; G11C 16/30; H10B 53/20
See application file for complete search history.

(56) References Cited

U.S. PATENT DOCUMENTS 7,782,675 B2　8/2010　Matsunaga et al.
7,872,921 B2　1/2011　Kim
(Continued)

OTHER PUBLICATIONS

Extended European Search Report corresponding to European Patent Application No. 23214997.1 (8 pages) (dated Apr. 5, 2024).

*Primary Examiner* — Huan Hoang
*Assistant Examiner* — Justin Bryce Heisterkamp
(74) *Attorney, Agent, or Firm* — Wolf, Greenfield & Sacks, P.C.

(57) ABSTRACT

A memory device includes a memory cell array having a plurality of memory blocks therein, including a target memory block. A voltage generator is provided, which is configured to generate an erase voltage and row line voltages, which are provided to the target memory block upon which an erase operation is to be performed. Control logic is provided, which is configured to control the memory cell array and the voltage generator. In addition, during operation, the erase voltage is provided to at least one of a bitline or a common source line associated with the target memory block, and a gate line of a transistor provided with the erase voltage is precharged before the erase voltage is provided to the at least one of the bitline or the common source line of the target memory block.

20 Claims, 24 Drawing Sheets

(51) Int. Cl.

| | |
|---|---|
| *G11C 16/08* | (2006.01) |
| *G11C 16/14* | (2006.01) |
| *G11C 16/24* | (2006.01) |
| *G11C 16/30* | (2006.01) |

(52) U.S. Cl.
CPC .............. *G11C 16/14* (2013.01); *G11C 16/24* (2013.01); *G11C 16/30* (2013.01)

(56)                    References Cited

U.S. PATENT DOCUMENTS

| | | | |
|---|---|---|---|
| 9,378,831 B2 | 6/2016 | Han et al. | |
| 9,514,828 B2 * | 12/2016 | Shim ..................... | G11C 16/24 |
| 9,620,217 B2 | 4/2017 | Lue et al. | |
| 10,600,486 B2 * | 3/2020 | Yun ....................... | G11C 16/04 |
| 10,658,044 B2 * | 5/2020 | Lee ........................ | G11C 16/32 |
| 11,646,086 B2 * | 5/2023 | Mun .................. | G11C 16/3445 365/185.22 |
| 2015/0138882 A1 | 5/2015 | Han et al. | |
| 2015/0170749 A1 * | 6/2015 | Park ................... | G11C 16/3445 365/185.05 |
| 2016/0141045 A1 * | 5/2016 | Shim ..................... | G11C 16/08 365/185.11 |
| 2018/0012634 A1 | 1/2018 | Sakui | |
| 2020/0411107 A1 | 12/2020 | Yu et al. | |
| 2021/0143160 A1 * | 5/2021 | Ryu ....................... | H10B 43/35 |
| 2022/0044733 A1 * | 2/2022 | Lee ....................... | G11C 16/24 |
| 2022/0076756 A1 * | 3/2022 | Lee ..................... | G11C 16/0433 |
| 2022/0319608 A1 | 10/2022 | Mun et al. | |
| 2022/0384475 A1 * | 12/2022 | Yang ..................... | H10B 43/27 |
| 2024/0120007 A1 * | 4/2024 | Choi .................. | H01L 25/0652 |
| 2024/0282383 A1 * | 8/2024 | Lee .................... | G11C 16/0483 |

* cited by examiner

FIG.7

BLKWL
(Vpre+γ → V1)

RL_SSLa
(Vpre → V1 )

SSLa
(Vpre)

PT_SSL

I_leakage

BLKWL
(Vpre+γ → GND)

RL_SSLa
(Vpre )

SSLa
(Vpre)

PT_SSL

I_leakage

FIG.18

MEMORY DEVICES SUPPORTING ENHANCED GATE-INDUCED DRAIN LEAKAGE (GIDL) ERASE OPERATION

REFERENCE TO PRIORITY APPLICATION

This application claims priority to Korean Patent Application No. 10-2022-0171531, filed Dec. 9, 2022, the disclosure of which is hereby incorporated herein by reference.

BACKGROUND

The present disclosure relates to semiconductor devices and, more particularly, to memory devices having a three-dimensional structure and methods of operating the same.

Memory devices are typically used to store data, and can be classified into volatile memory devices and nonvolatile memory devices. A flash memory device, which is an example of a nonvolatile memory device, may be used in mobile phones, digital cameras, personal digital assistants (PDAs), mobile computer devices, fixed computer devices, and other devices. With a recent trend for multifunctionality of information communication devices, there has been demand for memory devices having high capacity and high integration density. Accordingly, a three-dimensional (3D) nonvolatile memory device, including a plurality of word-lines stacked on a substrate in a vertical direction, have been proposed. More recently, research into gate-induced drain leakage (GIDL) erase schemes has been conducted for such 3D nonvolatile memory devices. Such a GIDL erase scheme may require a high-level voltage.

SUMMARY

Example embodiments provide a memory device, which is capable of essentially bypassing a transistor provided with an erase voltage during a GIDL erase operation.

According to an example embodiment, a memory device includes a memory cell array including a plurality of memory blocks, a voltage generation configured to generate an erase voltage and row line voltages to be provided to a target block, on which an erase operation is to be performed, among the plurality of memory blocks, and control logic configured to control the memory cell array and the voltage generator. The erase voltage may be provided to at least one of a bitline or a common source line of the target block, and a gate line of a transistor provided with the erase voltage may be precharged before the erase voltage is provided to the at least one of the bitline or the common source line of the target block.

According to another example embodiment, an erase method of a memory device is provided, for a memory block including a plurality of memory cell strings formed in a direction perpendicular to a substrate. The method includes: (i) precharging a string select line connected to a gate of a string select transistor, (ii) electrically floating the string select line, and (iii) providing an erase voltage, which is stepped up in voltage, to the gate of the string select transistor via a bitline, after the string select line is electrically floated.

According to a further example embodiment, a memory device is provided, which includes a plurality of memory cell strings that extend perpendicular to an underlying substrate. At least one of the plurality of memory cell strings may include a channel structure disposed on the substrate to be perpendicular to the substrate, a string select channel structure disposed on the channel structure, a select line disposed at the same height as the string select channel structure, and a plurality of row lines disposed adjacent to the channel structure. An erase voltage may be provided to an upper end of the string select channel structure via a bitline, and the select line may be precharged to a predetermined voltage level before the erase voltage is provided.

BRIEF DESCRIPTION OF DRAWINGS

The above and other aspects, features, and advantages of the present disclosure will be more clearly understood from the following detailed description, taken in conjunction with the accompanying drawings.

FIG. 7 is a diagram illustrating an example of voltage conditions of a string select transistor SST bypassed during a GIDL erase operation.

Figure 18:
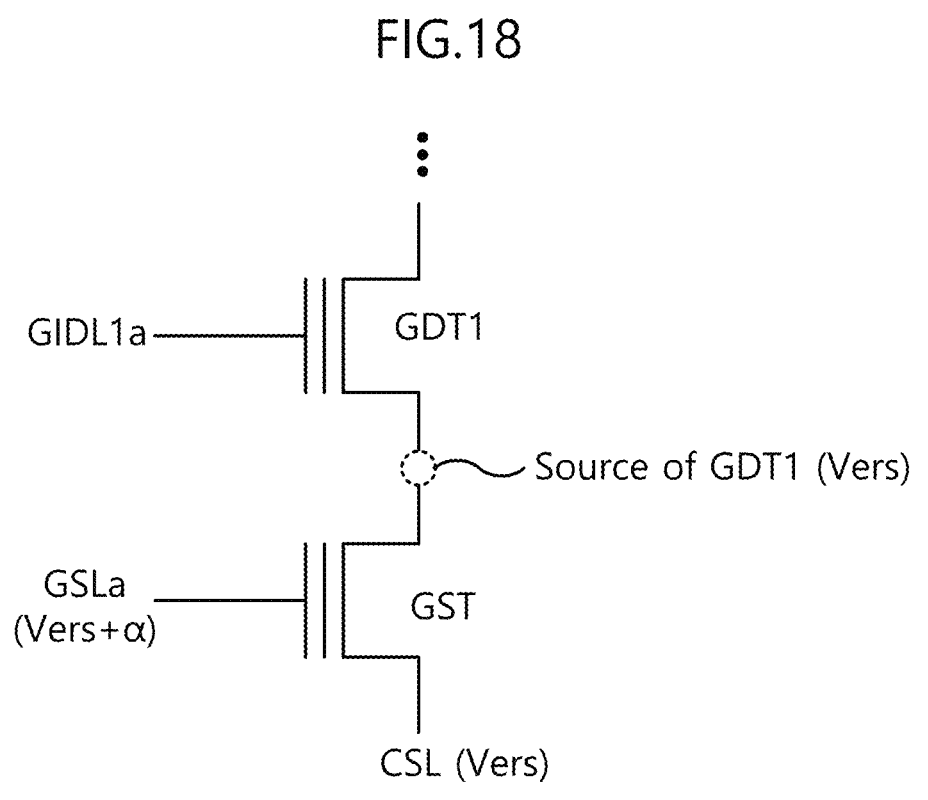

FIGS. 17 to 19 are diagrams provided to describe a memory device according to an exemplary embodiment.

DETAILED DESCRIPTION

Hereinafter, example embodiments will be described with reference to the accompanying drawings.

Figure 1:
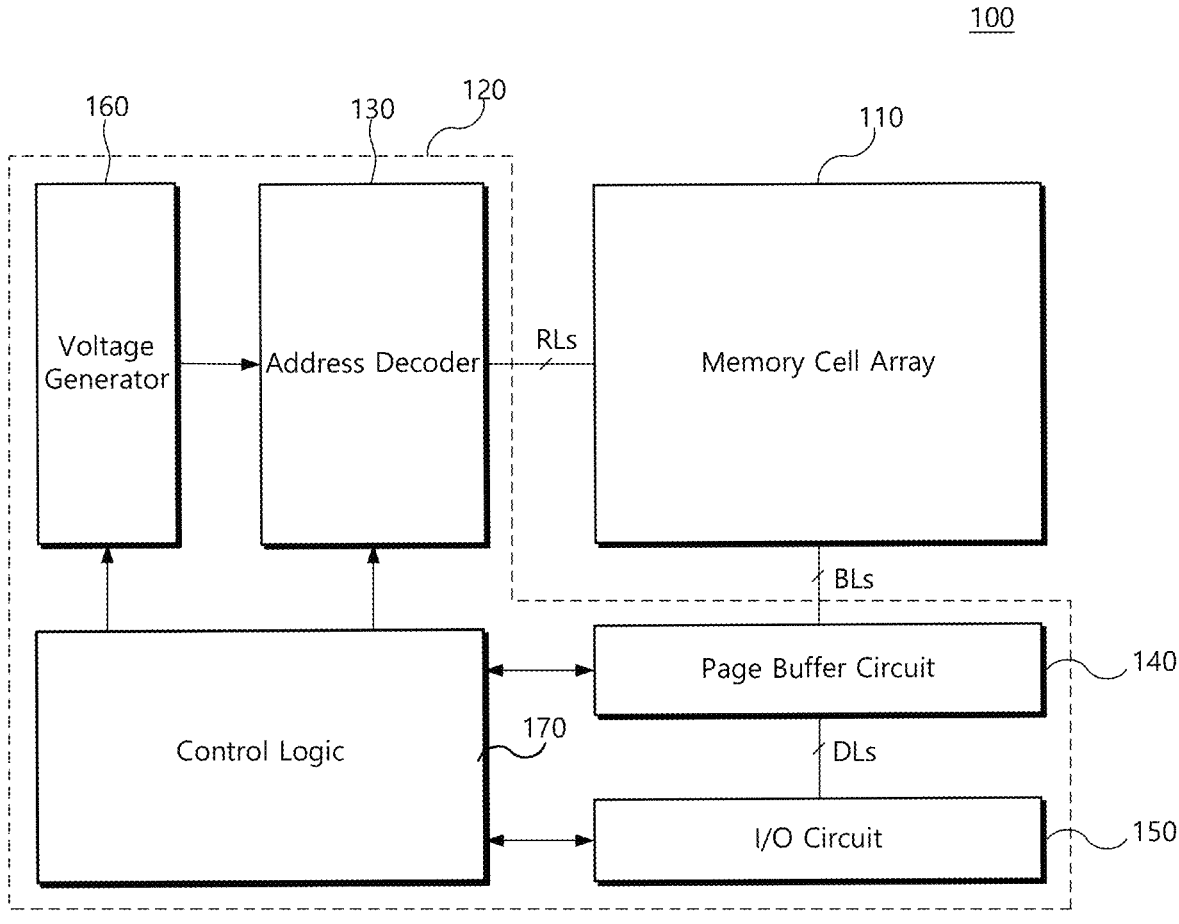
FIG. 1 is a block diagram illustrating a memory device according to an example embodiment.

FIG. 1 is a block diagram of a memory device 100 according to an example embodiment, which may support a gate-induced drain leakage (GIDL) erase operation. During this operation, an erase voltage may be provided to a transistor through a bitline BL or a common source line CSL, and the memory device 100 may bypass a transistor provided with the erase voltage. The term "bypass" may refer to transmission of an erase voltage, provided to one end (for example, a drain) of a transistor, to the other end (for example, a source) of the transistor without a significant voltage drop. By bypassing the transistor provided with the erase voltage, the memory device 100 according to an example embodiment may stably perform the GIDL erase operation in various structures.

As shown by FIG. 1, the memory device 100 may include a memory cell array 110 and a peripheral circuit 120, which includes: an address decoder 130, a page buffer circuit 140, an input/output (I/O) circuit 150, a voltage generator 160, and a control logic 170. The memory cell array 110 may include a plurality of memory blocks therein, and each of the memory blocks may have a two-dimensional (2D) structure or a three-dimensional (3D) structure, for example. Within a memory block having a two-dimensional structure (or a horizontal structure), memory cells may be formed in a lateral direction across a surface of a substrate; however, within a memory block having a three-dimensional structure (or a vertical structure), memory cells may be stacked in a direction that is perpendicular to the surface of the substrate. The address decoder 130 may be connected to the memory cell array 110 via row lines RLs. The row lines RLs may include string select lines SSLs, ground select lines GSLs, wordlines WLs, dummy wordlines DWLs, and GIDL lines GIDLs.

During an erase operation, the address decoder 130 may select a memory block that is to undergo an erase operation, in response to control of the control logic 170. Also, during the erase operation, the address decoder 130 may float at least one of the row lines RLs in response to the control of the control logic 170. The page buffer circuit 140 may be connected to the memory cell array 110 via bitlines BLs. The page buffer circuit 140 may temporarily store data to be programmed into a selected page, or data read from the selected page. The input/output circuit 150 may be internally connected to the page buffer circuit 140 via data lines DLs, and may be externally connected to a memory controller via an input/output (I/O) line.

The voltage generator 160 may generate various voltages required for operation of the memory device 100. For example, the voltage generator 160 may be configured to generate voltages to the row lines RLs during a read operation or a program operation, such as a plurality of program voltages, a plurality of program verify voltages, a plurality of pass voltages, a plurality of read voltages, a plurality of read pass voltages, or the like. In addition, the voltage generator 160 may generate an erase voltage and row line voltages to be used during the GIDL erase operation. For example, an erase voltage may be provided to a common source line and/or a bitline during the GIDL erase operation. The row line voltages may be provided to row lines such as a wordline, a dummy wordline, a ground select line, a string select line, or a GIDL line during the GIDL erase operation. The voltage generator 160 may generate the erase voltage and the row line voltage using a step-up method in which a target voltage is increased step by step.

The control logic 170 may control the overall operation of the memory device 100. In an example embodiment, the control logic 170 may control the memory device 100 such that a transistor provided with an erase voltage is bypassed during the GIDL erase operation. For example, an erase voltage may be applied to a specific transistor through a bitline connected to a drain or through a common source line (CSL) connected to a source. In this case, a gate line of the corresponding transistor may be precharged before the erase voltage is applied. Then, the gate line of the corresponding transistor may be floated. Then, as the erase voltage is provided to the drain or source of the corresponding transistor, a voltage level of the gate line of the corresponding transistor coupled to a channel may be increased/boosted (e.g., via capacitive coupling). When this happens, the voltage level of the gate line of the corresponding transistor may become higher than or equal to a level of the erase voltage. Since the voltage level of the gate line is higher than or equal to the level of the erase voltage, the erase voltage provided through one end (for example, the drain) of the transistor may be transmitted to the other end (for example, the source) of the transistor without significant drain-to-source or source-to-drain loss. Thus, as described above, the transistor provided with the erase voltage may be bypassed during the GIDL erase operation, so that the GIDL erase operation may be stably performed even in various structures.

Figure 2:
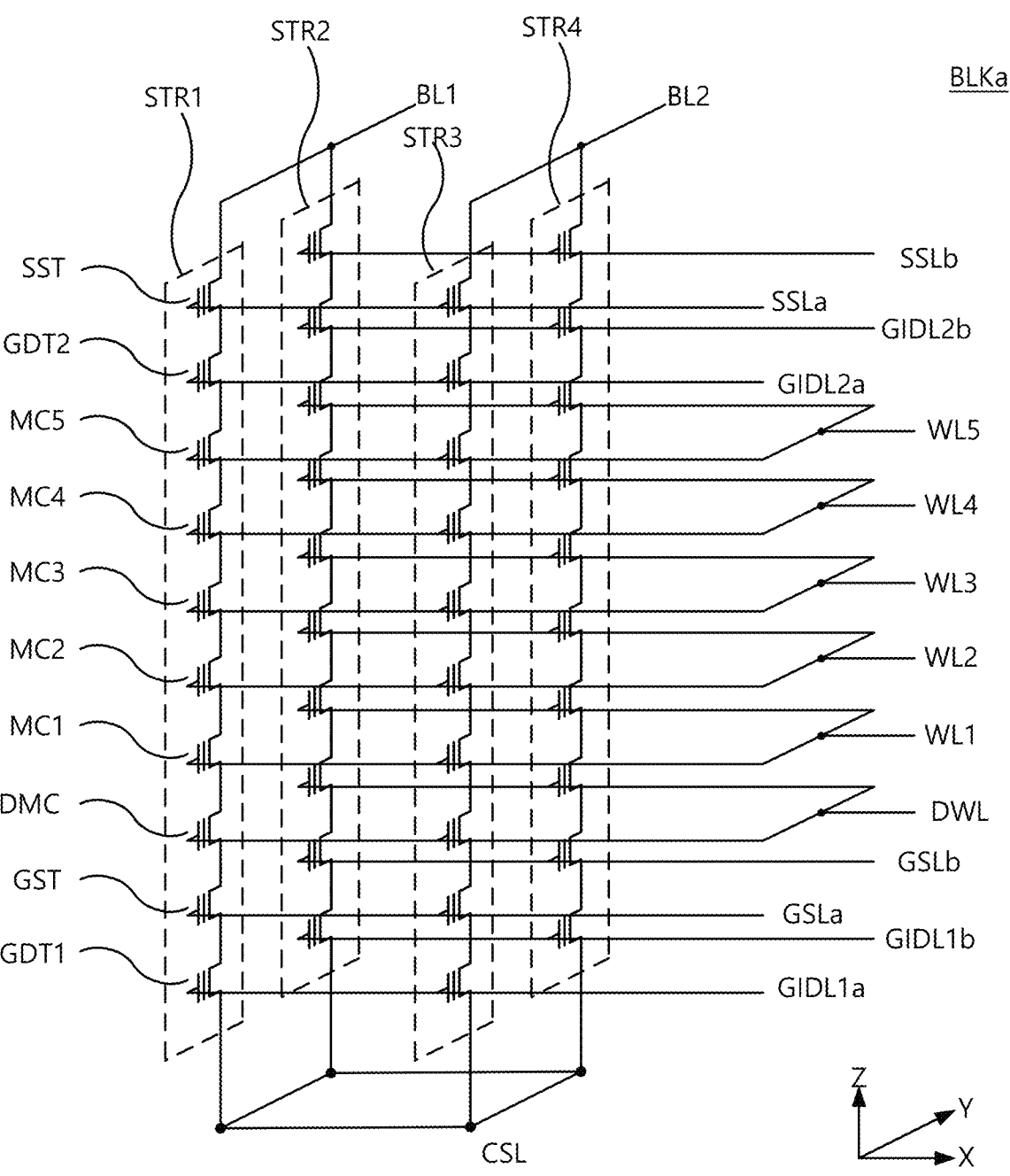
FIG. 2 is a circuit diagram illustrating a single memory block, among a plurality of memory blocks included in a memory cell array of FIG. 1.

FIG. 2 is a circuit diagram illustrating a single memory block, among a plurality of memory blocks included in the memory cell array 110 of FIG. 1. For ease of description, it will be assumed that the single memory block includes four strings STR1 to STR4. In addition, it will be assumed that a string select transistor SST is disposed on uppermost ends of the strings STR1 to STR4. As shown by FIG. 2, a memory block BLKa may include a plurality of strings STR1 to STR4, stacked vertically on a substrate. Each of the plurality of strings STR1 to STR4 may be disposed in a first direction (an X-axis direction) and a second direction (a Y-axis direction).

Among the plurality of strings STR1 to STR4, strings disposed in the same column may be connected to the same bitline. For example, the first and second strings STR1 and STR2 may be connected to a first bitline BL1, and the third and fourth strings STR3 and STR4 may be connected to a second bitline BL2.

Figure 3:
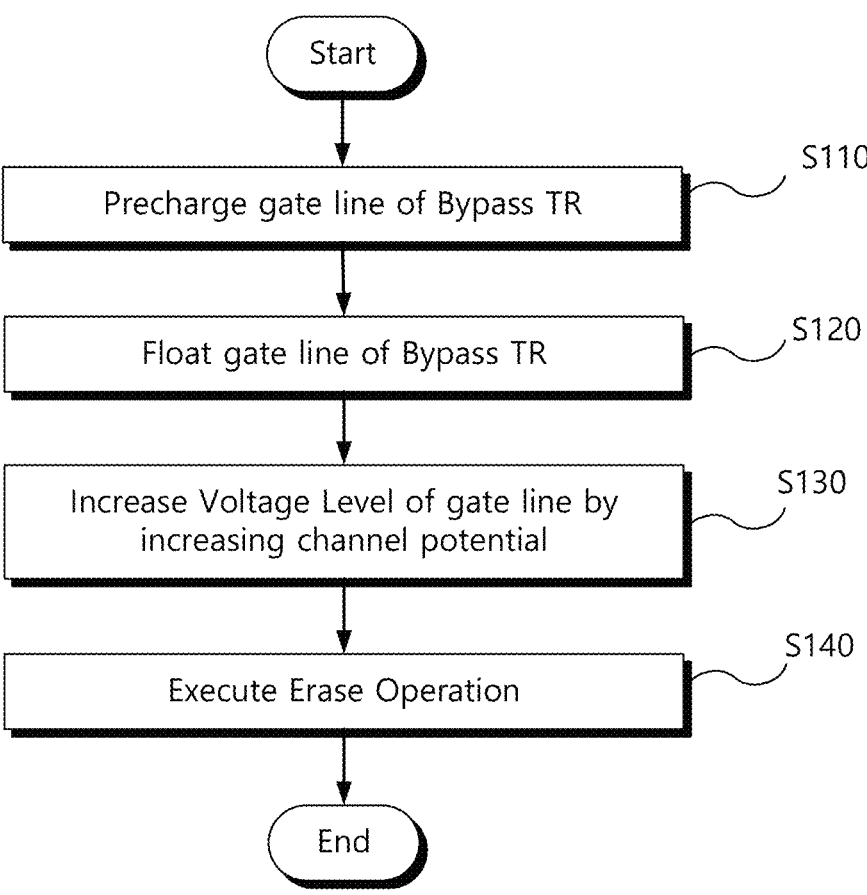
FIG. 3 is a diagram illustrating an example of an erase operation of the memory device of FIG. 1.

Each of the plurality of strings STR1 to STR4 may include a plurality of cell transistors. Each of the plurality of cell transistors may be a charge trap flash (CTF) memory cell, but example embodiments are not limited thereto. A plurality of cell transistors may be stacked in a third direction (a Z-axis direction). The plurality of strings STR1 to STR4 may be commonly connected to a common source line CSL. For example, as illustrated in FIG. 3, the common source line CSL may be commonly connected lower ends of the plurality of strings STR1 to STR4. However, this is merely exemplary, and the common source line CSL is not limited to being physically disposed on the lower ends of the strings STR1 to STR4 as long as it is electrically connected to the lower ends of the strings STR1 to STR4. Hereinafter, for ease of description, a structure and a configuration of a string will be described with respect to the first string STR1. Each of the other strings STR2, STR3, and STR3 may have a structure, similar to a structure of the first string STR1, and thus a detailed description thereof will be omitted.

A plurality of cell transistors may be connected in series between a first bitline BL1 and the common source line CSL. For example, the plurality of cell transistors may include GIDL transistors GDT1 and GDT2, a string select transistor SST, memory cells MC1 to MC5, a dummy memory cell DMC, and ground select transistors GST.

The first GIDL transistors GDT1 may be disposed on a lower end of the string STR1. For example, the first GIDL transistor GDT1 may be connected to the common source line CSL on the lower end of the string STR1. However, this is merely exemplary and, as will be described below in FIGS. 16 and 18, the first GIDL transistor GDT1 may be disposed on the lower end of the string STR1 and may be disposed between the ground select transistor GST and the dummy memory cell DMC. A gate of the first GIDL transistor GDT1 may be connected to a first GIDL line GIDL1a.

The second GIDL transistor GDT2 may be disposed on an upper end of the string STR1 and may be disposed between a string select transistor SST and a memory cell MC5. For example, the second GIDL transistor GDT2 may be connected to the first bitline BL1 through the string select transistor SST. A gate of the second GIDL transistor GDT2 may be connected to the second GIDL line GIDL2a.

In FIG. 2, the GIDL transistors GDT1 and GDT2 are illustrated as being on an upper end and a lower end of the string STR1. However, this is merely exemplary and, in some embodiments, a GIDL transistor may be provided on only an upper end of the string STR1 or a GIDL transistor may be provided on only a lower end of the string STR1. In addition, additional GIDL transistors associated with strings STR2, STR4 may be provided, which are electrically connected to GIDL lines GIDL1b and GIDL2b.

A single string select transistor SST may be disposed on an uppermost end of a string STR. The string select transistor SST may be connected to the first bitline BL1 on an uppermost end of a string STR1. A gate of the string select transistor SST may be connected to a string select line SSLa. However, this is merely exemplary and, in some embodiments, a plurality of string select transistors connected in series may be provided between the first bitline BL1 and the second GIDL transistor GDT2.

A single ground select transistor GST may be provided between the dummy memory cell DMC and the first GIDL transistor GDT1. A gate of the ground select transistor GST may be connected to a ground select line GSLa. However, this is merely exemplary and, in some embodiments, a plurality of ground select transistors connected in series may be provided between the dummy memory cell DMC and the first GIDL transistor GDT1.

The first to fifth memory cells MC1 to MC5 may be connected in series between the string select transistor SST and the dummy memory cell DMC. Gates of the first to fifth memory cells MC1 to MC5 may be connected to the first to fifth wordlines WL1 to WL5, respectively.

A single dummy memory cell DMC may be provided between the first memory cell MC1 and the first GIDL transistor GDT1. A gate of the dummy memory cell DMC may be connected to a dummy wordline DWL. However, this is merely exemplary and, in some embodiments, a plurality of dummy memory cells connected in series may be provided between the first memory cell MC1 and the first GIDL transistor GDT1. Alternatively, an additional dummy memory cell may be provided between the string select transistor SST and a fifth memory cell MC5. Alternatively, additional dummy memory cells may be provided between the memory cells MC1 to MC5. Alternatively, the dummy memory cell DMC may not be provided.

During the GIDL erase operation, the first GIDL transistor GDT1 or the second GIDL transistor GDT2 may operate as a transistor for generating holes. For example, an erase voltage may be applied to a drain of the second GIDL transistor GDT2, and a GIDL voltage may be applied to a gate of the second GIDL transistor GDT2. In this case, a high electric field may be generated in a channel region, adjacent to the second GIDL transistor GDT2, due to a potential difference between the erase voltage and the GIDL voltage. Due to such a high electric field, holes may be generated in the channel region adjacent to the second GIDL transistor GDT2. Similarly, the erase voltage may be applied to a source of the first GIDL transistor GDT1, and the GIDL voltage may be applied to a gate of the first GIDL transistor GDT1. In this case, holes may be generated in a channel region adjacent to the first GIDL transistor GDT1.

In some embodiments, as illustrated in FIG. 2, the string select transistor SST may be disposed between the first bitline BL1, provided with an erase voltage, and the second GIDL transistor GDT2 in which holes are generated. In this case, according to an example embodiment, the erase voltage provided through the first bitline BL1 may be transmitted the second GIDL transistor GDT2 by bypassing the string select transistor SST. By bypassing the string select transistor SST provided with the erase voltage, the memory device 100 according to an example embodiment may stably perform the GIDL erase operation even in a structure in which the string select transistor SST is disposed on an uppermost end of the string STR1.

In some embodiments, the ground select transistor GST may be disposed on a lower end of the string STR1 to be connected to the common source line CSL. Even in such a structure, by bypassing the ground select transistor GST, the memory device 100 according to an example embodiment may stably perform the GIDL erase operation.

FIG. 3 is a diagram illustrating an example of an erase operation of the memory device 100 of FIG. 1. In operation S110, a gate line of a bypass transistor may be precharged. The term "bypass transistor" may refer to a transistor, other than a GIDL transistor provided with an erase voltage through a bitline or a common source line during a GIDL erase operation. For example, referring to FIG. 2, the string select transistor SST connected to the first bitline BL1 may be a bypass transistor. In this case, the string select line SSLa connected to the gate of the string select transistor SST may be precharged to a predetermined voltage level.

Next, in operation S120, a gate line of the bypass transistor may be floated. For example, referring to FIG. 2, the string select line SSLa connected to the string select transistor SST may be floated. Then, in operation S130, a potential of a channel coupled to the gate line of the bypass transistor may be increased. Accordingly, a voltage level of the gate line of the bypass transistor may also be increased.

For example, referring to FIG. 2, an erase voltage stepped up may be provided through the first bitline BL1. Accordingly, a voltage potential of a channel may be stepped up. Since the string select line SSLa is in a floating state, a voltage level of the string select line SSLa coupled to the channel may also be stepped up. In this case, a voltage level of the string select line SSLa may be increased to a voltage level, sufficient to bypass the erase voltage provided to the drain of the string select transistor SST. For example, the voltage level of the string select line SSLa may be increased to a level, higher than or equal to a level of the erase voltage.

Finally, in operation S140, a GIDL erase operation may be performed. For example, referring to FIG. 2, the voltage provided through the first bitline BL1 may bypass the string select transistor SST and may be provided to the second GIDL transistor GDT2. Accordingly, the GIDL erase operation may be successfully performed.

As described above, the memory device 100 according to an example embodiment may bypass a transistor connected to a bitline or a common source line during a GIDL erase operation. Accordingly, the erase voltage provided through the bitline or the common source line may be provided to the GIDL transistor without significant loss, and thus a GIDL erase operation may be stably performed. Advantageously, the GIDL erase operation according to an example embodiment may be applied to various structures and may be used therein. Hereinafter, various embodiments will be described in more detail.

Figure 4A:
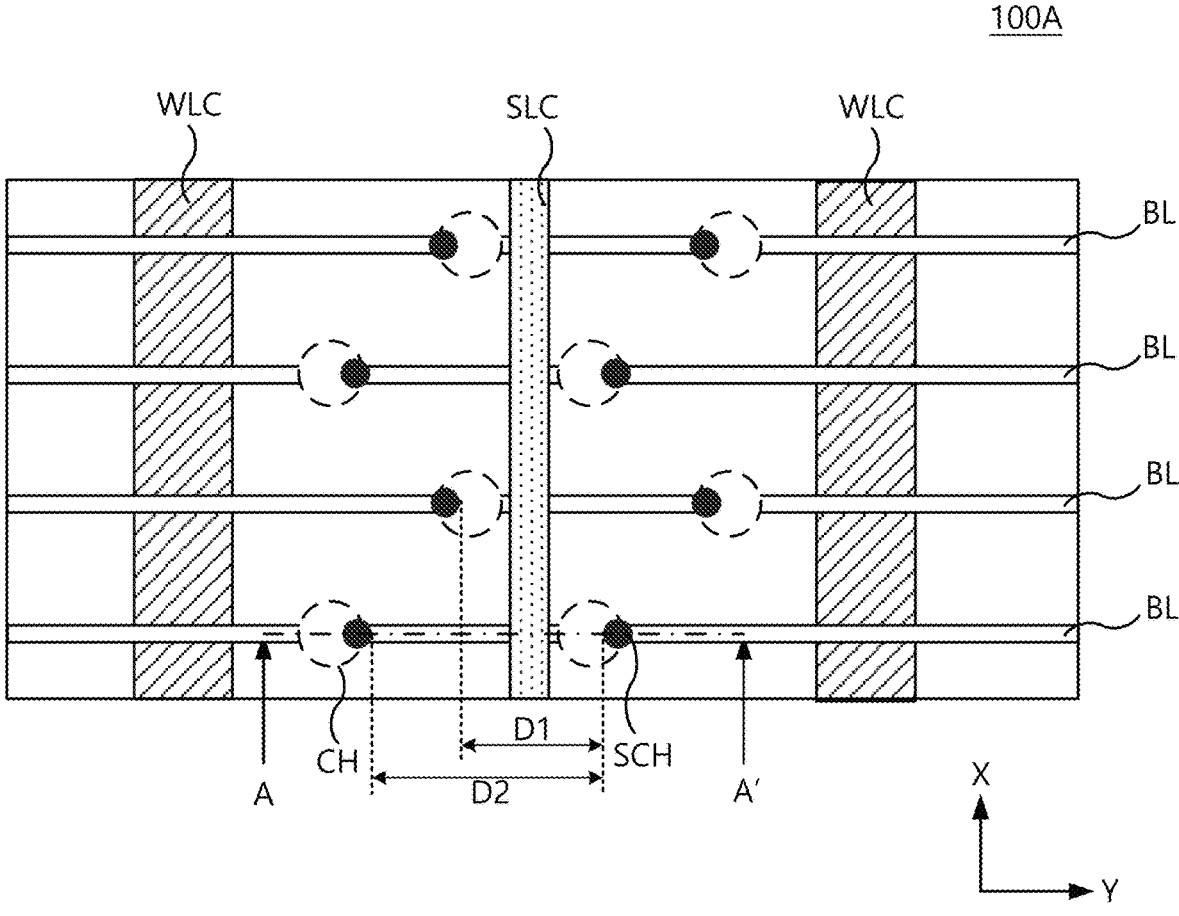
FIG. 4A is a plan view illustrating an example of a memory device according to an exemplary embodiment.
Figure 4B:
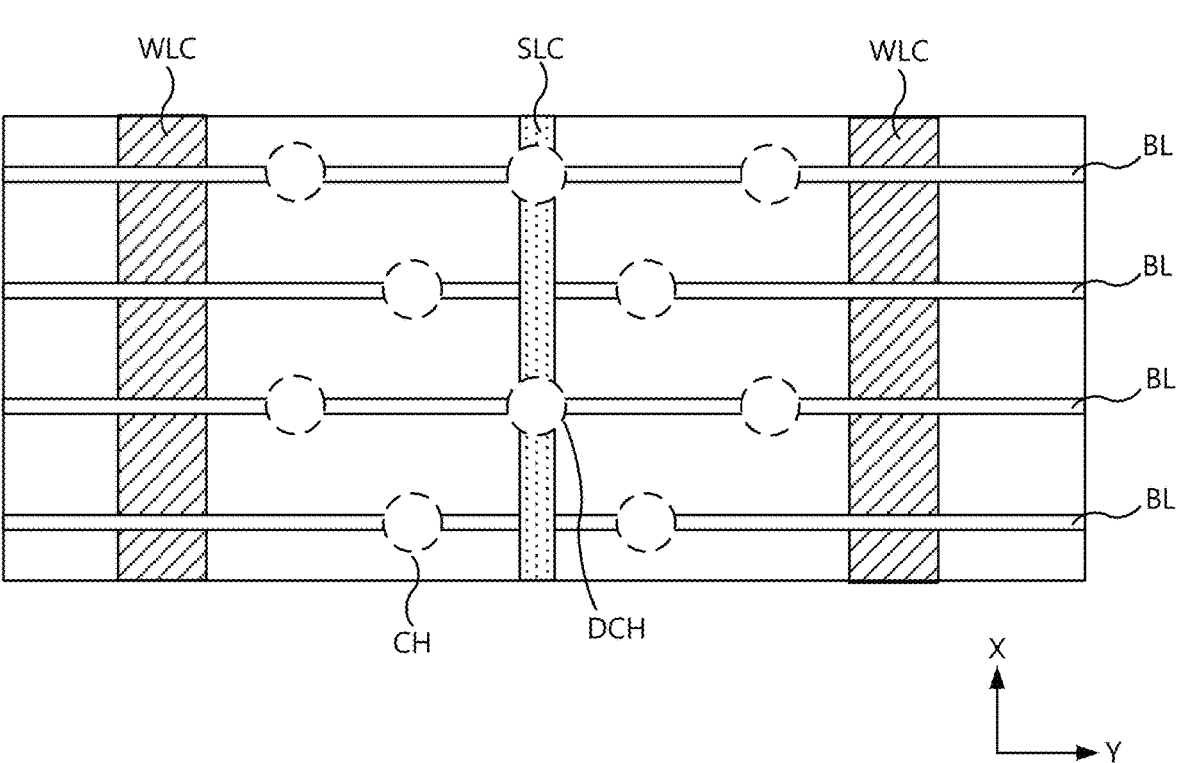
FIG. 4B is a plan view illustrating an example of a memory device in which a string select channel structure is not formed.

FIG. 4A is a plan view illustrating an example of a memory device according to an exemplary embodiment. FIG. 4B is a plan view illustrating an example of a memory device in which a string select channel structure is not formed. Referring to FIG. 4A, a memory device 100A according to an example embodiment may include channel structures CH and string select channel structures SCH.

The channel structures CH may each constitute a single string STR, and may be arranged in rows and columns to be spaced apart from each other when viewed from above. As illustrated in FIG. 4, the channel structures CH may be arranged in a zigzag pattern when viewed from above. However, this is merely exemplary and the channel structures CH may be arranged in various patterns.

The string select channel structures SCH may be arranged in rows and columns to be spaced apart from each other when viewed from above. At least a portion of the string select channel structures SCH may be disposed to overlap the channel structures CH when viewed from above. As illustrated in FIG. 4A, the string select channel structures SCH may be arranged in a zigzag pattern when viewed from above. However, this is merely exemplary and the string select channel structures SCH may be arranged in various patterns. In addition, each of the string select channel structures SCH may be connected to a bitline BL extending in a second direction (a Y-axis direction).

A wordline separation region WLC may extend in a first direction (an X-axis direction) and may separate row lines, stacked in a third direction (a Z-axis direction), from each other. Row lines, separated by a pair of wordline separation regions WLC, may constitute a single memory block. However, this is merely exemplary and the scope of the memory block is not limited thereto.

A sub-separation region SLC may extend in the first direction (the X-axis direction) and may be formed at the same height as the string select transistor SST (see FIG. 2). The sub-separation region SLC may separate the string select lines SSLs, corresponding to the string select transistor SST, from each other. For example, first and second string select transistors SSLa and SSLb formed at the same height may be separated from each other by the sub-separation region SLC.

In an example embodiment, the string select channel structure SCH may be formed to have a diameter, smaller than a diameter of the channel structure CH. In addition, the string select channel structure SCH may be disposed to overlap the channel structure CH when viewed from above, but may be shifted in one direction to partially overlap the channel structure CH. Accordingly, a sufficient distance D2 may be formed between the string select channel structures SCH disposed in the same row in the second direction (the Y-axis direction), and a sufficient distance D1 may even be formed between string select channel structures SCH disposed in different rows. As a result, the sub-separation region SLC may be formed between the string select channel structures SCH without a dummy channel structure.

A more detailed description will be provided with reference to FIG. 4B. In the case of a memory device according to the related art, a space for forming the sub-separation region SLC may be insufficient. Accordingly, the sub-separation region SLC may be formed on a channel structure and the channel structure, overlapping the sub-separation region SLC, may be defined as a dummy channel structure DCH. The dummy channel structure DCH is incapable of storing data, resulting in a decrease in data storage capacity.

Meanwhile, in the memory device 100A according to an example embodiment, the sub-separation region SLC may be formed between the string select channel structures SCH without a dummy channel structure. Accordingly, the memory device 100A according to an example embodiment may have increased data storage capacity, or a space required to provide the same data capacity may be reduced.

Figure 5:
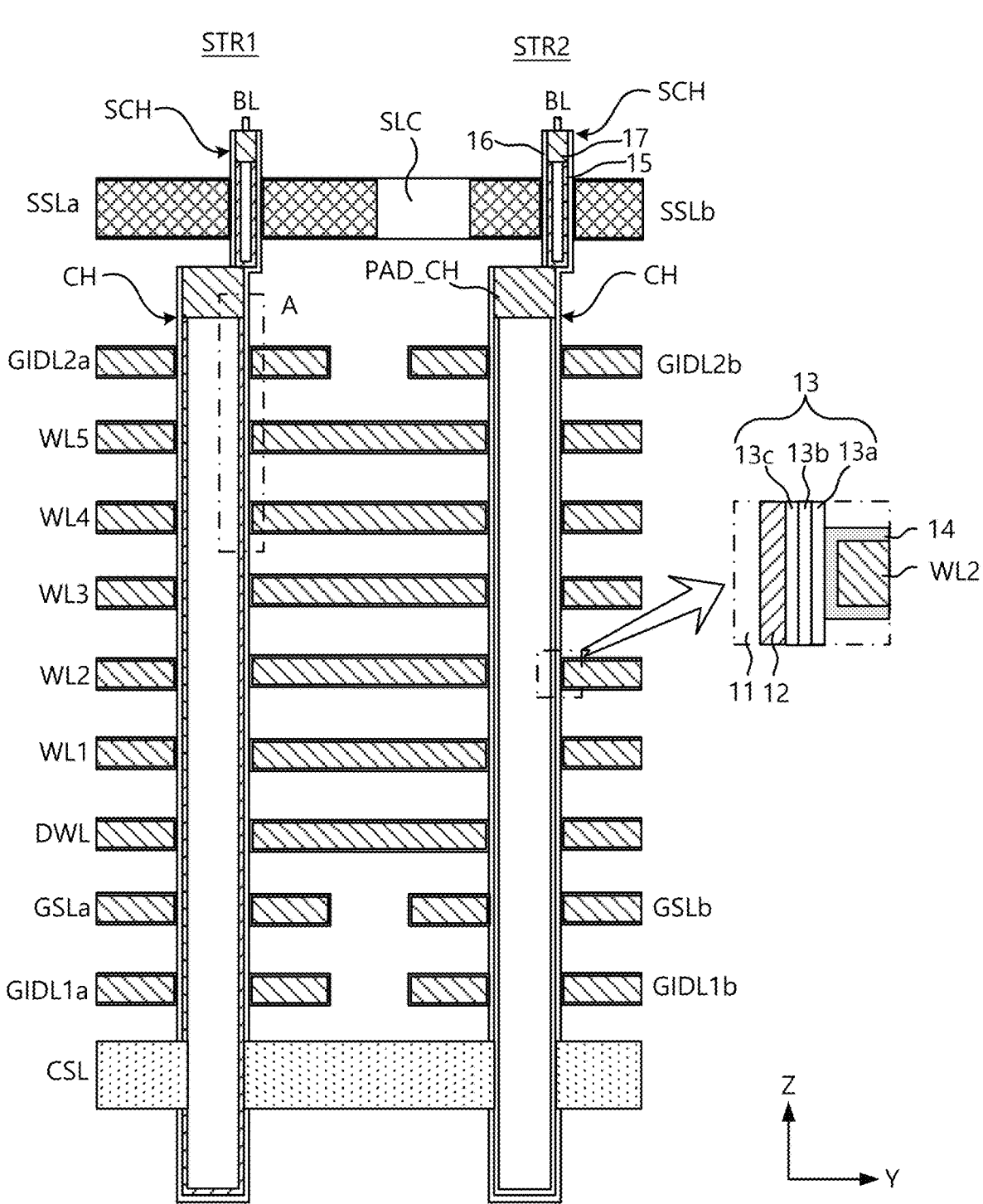
FIG. 5 is a diagram illustrating an example of a cross-section taken along line A-A' of FIG. 4.

FIG. 5 is a diagram illustrating an example of a cross-section taken along line A-A' of FIG. 4. Referring to FIG. 5, each of the strings STR1 and STR2 may include a string select channel structure SCH and a channel structure CH, and a portion of the string select channel structure may be formed to overlap the channel structure CH.

The channel structure CH may include a vertical channel layer 12, a buried insulating layer 11 filling an internal space of the vertical channel layer 12, and a vertical insulating layer 13 disposed between the vertical channel layer 12 and row lines. In some embodiments, the channel structure CH may have an inclined side surface having a diameter decreased in a direction toward a substrate. Alternatively, in some embodiments, the channel structure CH may have an inclined side surface having a diameter increased in a direction toward the substrate. Alternatively, in some embodiments, each of the strings STR1 and STR2 may include two or more channel structures CHs stacked in a vertical direction.

The vertical channel layer 12 may include a semiconductor material such as polycrystalline silicon (polysilicon) or single-crystalline silicon. For example, the semiconductor material may be an undoped material. In some embodiments, the vertical channel layer 12 may have a columnar shape such as a cylindrical shape or a prismatic shape without the buried insulating layer 11. The vertical insulating layer 13 may include a blocking layer 13a, a charge storage layer 13b, and a tunnel insulating layer 13c.

The blocking layer 13a may be interposed between the charge storage layer 13b and the row lines. At least a portion of the blocking layer 13a may be formed to have a shape surrounding the row lines to be provided on the blocking layer 14. The blocking layer 13a may include a material having an energy band gap, larger than an energy band gap of the charge storage layer 13b. For example, the blocking layer 13a may be a silicon oxide layer, a silicon nitride layer, and/or a silicon oxynitride layer.

The charge storage layer 13b may be interposed between the blocking layer 13a and the tunnel insulating layer 13c. For example, the charge storage layer 13b may include at least one of a silicon nitride layer, a silicon oxynitride layer, a silicon-rich nitride layer, a nanocrystalline silicon layer, or a laminated trap layer.

The tunnel insulating layer 13c may be interposed between the charge storage layer 13b and the vertical channel layer 12. The tunnel insulating layer 13*c* may include a material having a band gap, larger than a band gap of the charge storage layer 13*b*. For example, the tunnel insulating layer 13*c* may be a silicon oxide layer.

A plurality of row lines may be alternately stacked on the common source line CSL. The plurality of row lines may include, for example, a first GIDL line GIDL1*a*, a ground select line GSLa, a dummy wordline DWL, first to fifth wordlines WL1 to WL5, and a second GIDL line GIDL2*a*. The plurality of row lines may include, for example, poly-silicon, a metal such as tungsten (W), and/or a conductive metal nitride.

The string select channel structure SCH may be formed on the channel structure CH. A portion of the string select channel structure SCH may overlap the channel structure CH. The string select channel structure SCH and the channel structure CH may be electrically connected to each other through a channel pad PAD_CH. The string select channel structures SCH may include a string select channel layer 15, a string select insulating layer 16, and a string select channel pad 17.

The string select channel layer 15 may be formed to have an annular shape surrounding an insulating layer therein. In some embodiments, the string select channel layer 15 may have a columnar shape such as a cylindrical shape or a prismatic shape. The string select channel layer 15 may be connected to the channel structure CH provided therebelow, and may be in contact with the channel pad PAD_CH. The string select channel layer 15 may include a semiconductor material such as polysilicon or single-crystalline silicon, and the semiconductor material may be an undoped material or a material including P-type or N-type impurities. For example, the string select channel layers 15 may include the same material as the vertical channel layer 12. In addition, the string select insulating layer 16 may be formed to surround the string select channel layer 15. For example, the string select insulating layer 16 may include the same material as the vertical insulating layer 13.

The string select channel pad 17 may be formed on an upper end of the string select channel structure SCH and may be electrically connected to a bitline BL. For example, the string select channel pad 17 may be formed of a conductive material, such as doped polysilicon. The bitline BL may be disposed on the string select channel pad 17.

Each of the string select lines SSLa and SSLb may extend in the second direction (the Y-axis direction) and may be formed at the same height as the string select channel structure SCH. The first string select line SSLa and the second string select line SSLb may be separated from each other by the sub-separation region SLC. The number of string select lines SSLa and SSLb is not limited to that illustrated in the drawing, and additional string select lines may be disposed in the third direction (the Z-axis direction).

The string select lines SSLa and SSLb may include a semiconductor material such as polysilicon or single-crys-talline silicon, and the semiconductor material may be an undoped material or a material including P-type or N-type impurities. An erase voltage may be provided to a string STR through one of the bitline BL or a common source line CSL during a GIDL erase operation. Alternatively, the erase voltage may be provided to opposite ends of the string STR through both a bitline BL and a common source line CSL during the GIDL erase operation.

Figure 6:
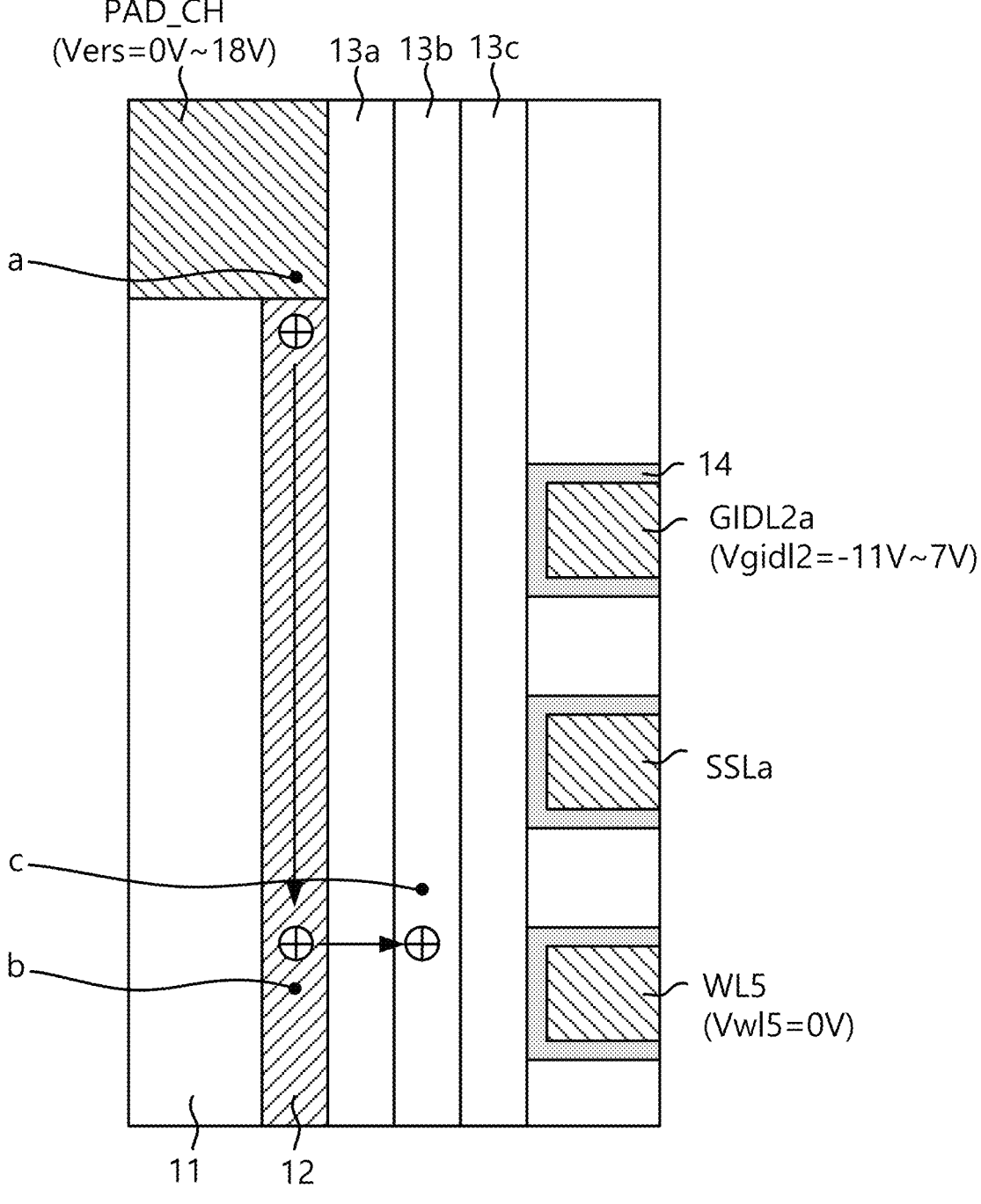
FIG. 6 is an enlarged cross-sectional view of region "A" of FIG. 5.

FIG. 6 is an enlarged cross-sectional view of region "A" of FIG. 5. For ease of description, it will be assumed that an erase voltage Vers is provided through a bitline BL during a GIDL erase operation. Referring to FIG. 6, an erase voltage Vers may be applied to a bitline BL during a GIDL erase operation. The erase voltage Vers may be provided to a channel pad PAD_CH through a string select channel struc-ture SCH. In this case, the erase voltage Vers may be provided to the channel pad PAD_CH by bypassing the string select transistor SST (see FIG. 2) corresponding to a string select channel structure SCH.

A second GIDL voltage Vgidl2 may be applied to a second GIDL line GIDL2*a* during the GIDL erase operation. For example, a target voltage level of the erase voltage Vers may be 18 V. The second GIDL voltage Vgidl2 may be applied while maintaining a constant potential difference with the erase voltage Vers. A wordline voltage Vwl5 may also be applied to a fifth wordline WL5 during the erase operation. For example, this voltage may be Vwl5=0 V.

The erase voltage Vers may be stepped up until reaching a target voltage level. A time period during which the erase voltage Vers steps up to the target voltage level, may be referred to as a set-up period. During the set-up period, the second GIDL voltage Vgidl2 may step up while maintaining a constant potential difference with the erase voltage Vers.

In this case, a magnitude and a pulse width of a unit step voltage of the erase voltage Vers may be the same as a magnitude and a pulse width of a unit step voltage of the second GIDL voltage Vgidl2, respectively. For example, when the erase voltage Vers steps up from 0 V to 18 V, the second GIDL voltage Vgidl2 may step up from −11 V to 7 V. Accordingly, the second GIDL voltage Vgidl2 may main-tain a constant potential difference (for example, 11 V) with the erase voltage Vers during the erase operation. Since the second GIDL voltage Vgidl2 and the erase voltage Vers step up while maintaining a constant potential difference (for example, 11 V), the potential difference (for example, 11 V) may occur between a second GIDL line GIDL2*a* and the first bitline BL1. When the first potential difference occurs between the second GIDL line GIDL2*a* and the first bitline BL1, a band-to-band tunneling effect may occur in a junc-tion region "a" between the vertical channel layer 12 and the first bitline BL1.

Electrons of the vertical channel layer 12 may be moved to the junction region "a" due to the band-to-band tunneling effect, and holes (+) may be generated in a location in which the electrons were present. An electrically isolated region may be formed in a portion of the vertical channel layer 12 adjacent to the second GIDL line GIDL2*a* and the holes (+) may be accumulated in the electrically isolated region. As the first potential difference occurring between the second GIDL line GIDL2*a* and the first bitline BL1 is increased, an absolute amount of the holes (+) accumulated in the elec-trically isolated region may be increased.

The fifth wordline voltage Vwl5 may be applied to the fifth wordline WL5 during the set-up period. The fifth wordline voltage Vwl5 may be, for example, 0 V. The string select transistor SST may be in a turned-off state, and thus the vertical channel layer 12 may be in a floating state. In this case, the fifth wordline voltage Vwl5 may be coupled to the vertical channel layer 12 with insulating layers 13*a* to 13*c* interposed therebetween. Due to the coupling effect, the same voltage (for example, 0 V) as the fifth wordline voltage Vwl5 may also be applied to a vertical channel layer "b" adjacent to the fifth wordline WL5. Accordingly, a second potential difference (for example, 0 V to 18 V) may occur between the junction region "a" and the vertical channel layer "b" adjacent to the fifth wordline WL5.

When a second potential difference occurs between the junction region "a" and the vertical channel layer "b" adjacent to the fifth wordline WL5, the holes (+) accumulated in the electrically isolated region may be moved along the vertical channel layer 12 in a direction of the fifth wordline WL5. As the second potential difference between the junction region "a" and the vertical channel layer "b" adjacent to the fifth wordline WL5 is increased, the holes (+) may be more rapidly moved from the electrically isolated region in the direction of the fifth wordline WL5.

Following the set-up period, the erase voltage Vers may be maintained at the target voltage level. A time period during which the erase voltage Vers is maintained at the target voltage level, may be referred to as an execution period. During the execution period, holes (+) of the vertical channel layer "b" adjacent to the fifth wordline WL5 may be moved to a charge storage layer 13b adjacent to the fifth wordline WL5. During the execution period, a third potential difference may occur between the vertical channel layer "b" adjacent to the fifth wordline WL5 and the charge storage layer 13b. As the third potential difference is increased, an absolute amount of the holes (+) moved to the charge storage layer 13b may be increased.

As discussed above with reference to FIG. 6, the holes (+) generated in the junction region "a" of the channel pad PAD_CH) on the upper end of the string (STR) may be injected into the vertical channel layer 12 during the set-up period of the GIDL erase operation, and the holes (+) injected into the vertical channel layer 12 may migrate to the charge storage layer 13b during the execution period of the erase operation. Accordingly, data stored in the memory cell may be erased.

Figure 7:
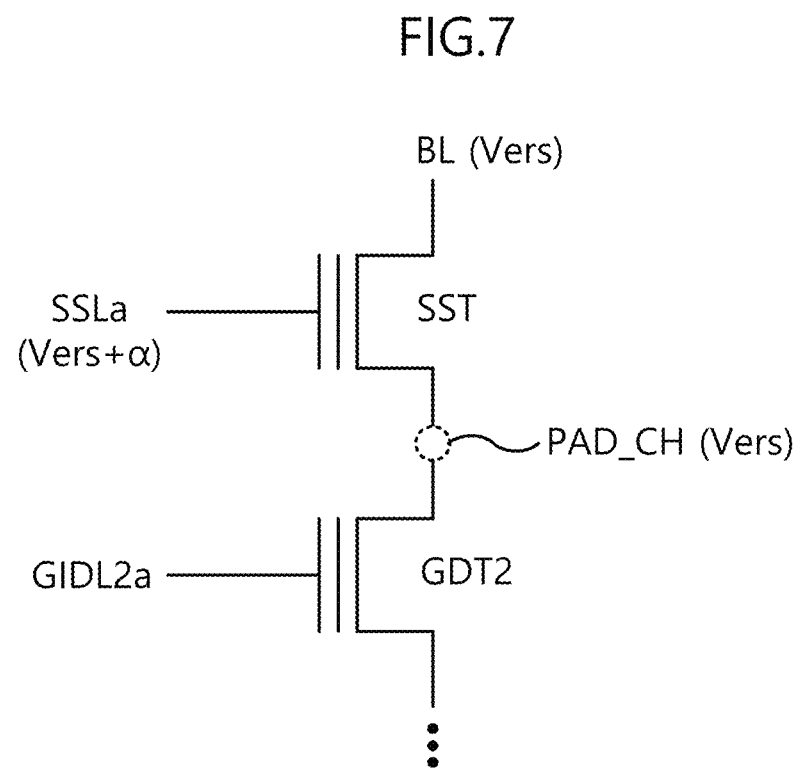

FIG. 7 is a diagram illustrating an example of voltage conditions of a string select transistor SST bypassed during a GIDL erase operation. As described above in FIG. 6, the erase voltage Vers applied through the bitline BL should be transmitted to a drain of the second GIDL transistor GDT2 by bypassing the string select transistor SST to perform the GIDL erase operation. To this end, a voltage, which is higher than the erase voltage Vers, should be provided to a gate of the string select transistor SST. For example, a voltage level of the string select line SSLa may be Vers+a, where a may be higher than or equal to a threshold voltage Vth of the string select transistor SST.

Figure 8:
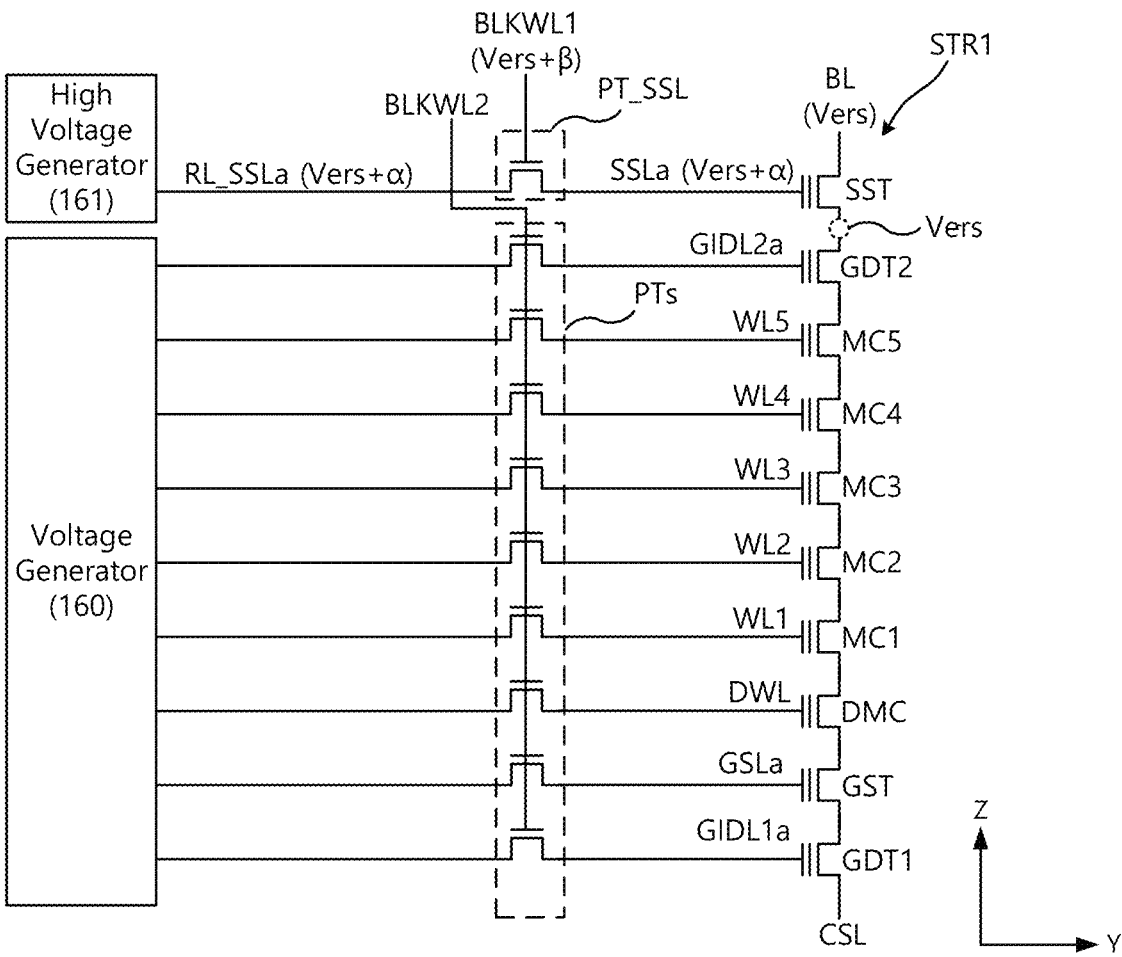
FIG. 8 is a diagram illustrating an example embodiment in which a voltage of a string select line is generated to have a high level.
Figure 9:
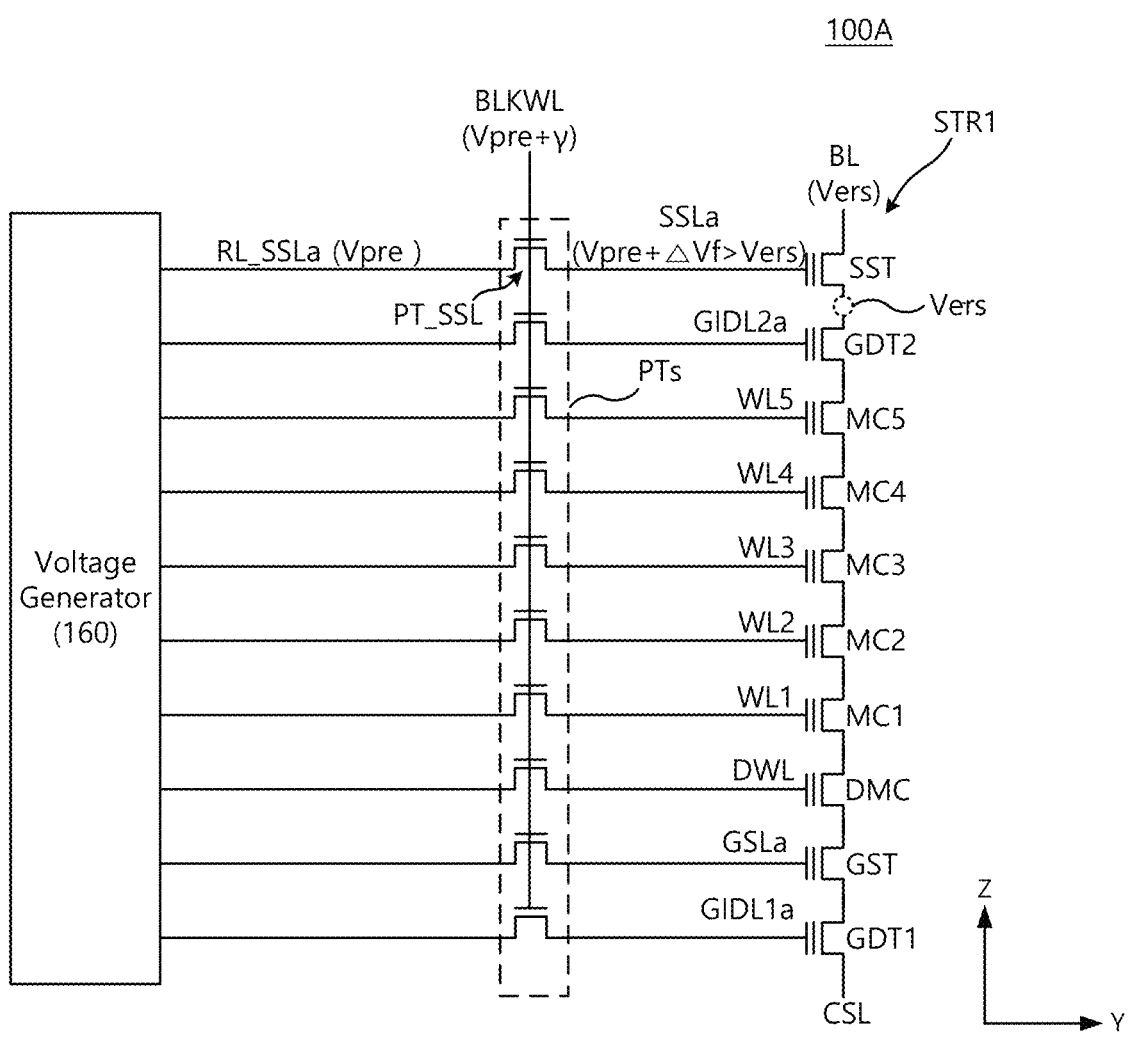
FIG. 9 is a diagram illustrating another example embodiment in which a voltage of a string select line is generated to have a high level.

FIG. 8 is a diagram illustrating an example embodiment in which a voltage of a string select line is generated to have a high level. FIG. 9 is a diagram illustrating another example embodiment in which a voltage of a string select line is generated to have a high level. Referring to FIG. 8, a high voltage may be directly applied to the string select line SSLa such that a voltage of the string select line SSLa is generated to have a level higher than a level of the erase voltage Vers.

For example, the high voltage generator 161 may generate a high voltage, higher than the erase voltage Vers, and may provide the high voltage to a string select row line RL_SSLa. The string select row line RL_SSLa may be connected to the string select line SSLa through a pass transistor PT_SSL. The pass transistor PT_SSL may be turned on in response to a voltage level of a first block wordline BLKWL to transmit a voltage of the string select row line RL_SSLa to the string select line SSLa with little voltage drop. In this case, a voltage level Vers+β of the first block wordline BLKWL1 may be higher than the voltage level Vers+α of the string select row line RL_SSLa.

As described above, the memory device of FIG. 8 may additionally include a high-voltage generator generating a voltage higher than the erase voltage Vers such that a voltage of the string select line SSLa is generated to have a level that is higher than a level of the erase voltage Vers. In addition, since a voltage higher than the erase voltage Vers should be applied to a gate of a pass transistor PT_SSL corresponding to the string select line SSLa, the pass transistor PT_SSL may be driven independently of the other pass transistors PTs.

Referring to FIG. 9, in a memory device 100A according to an example embodiment, a string select line SSLa may be precharged before a set-up period, so that a voltage of the string select line SSLa may be generated to have a level higher than a level of the erase voltage Vers.

For example, the voltage generator 160 may generate a precharge voltage Vpre and may transmit the precharge voltage Vpre to the string select row line RL_SSLa. The precharge voltage Vpre may have a level that is lower than a level of the erase voltage Vers, but higher than a level of a threshold voltage of a string select transistor SST.

The pass transistor PT_SSL may be turned on in response to the voltage level of the block wordline BLKWL to transmit the precharge voltage Vpre of the string select row line RL_SSL to the string select line SSLa. In this case, a voltage level Vpre+γ of a block wordline BLKWL may be higher than the precharge voltage, where γ may be higher than or equal to a threshold voltage Vth of a pass transistor PT_SSL. When a voltage level of the string select line SSLa is precharged to the precharge voltage Vpre, the string select line SSLa may be floated. For example, the voltage level of the block wordline BLKWL and the voltage level of the string select row line RL_SSLa are adjusted to be equal to each other, so that the string select line SSLa may be floated.

Then, a set-up period may be performed. Accordingly, a potential of a channel may be stepped up, and a voltage level of the string select line SSLa coupled to the channel may also be stepped up. As a result, the voltage level of the string select line SSLa may be increased to a level "Vpre+ΔVf", which is higher than a level of the erase voltage Vers, and the erase voltage Vers provided through the bitline BL may be provided to a drain of a second GIDL transistor GDT2 by bypassing the string select transistor SST. As described above, the string select line SSLa may be precharged, so that the memory device 100A according to an example embodiment may generate a voltage of the string select line SSLa to have a high level without including an additional high-voltage generator. Thus, the string select transistor SST may be essentially bypassed during a GIDL erase operation, allowing the GIDL erase operation to be stably performed.

Figure 10:
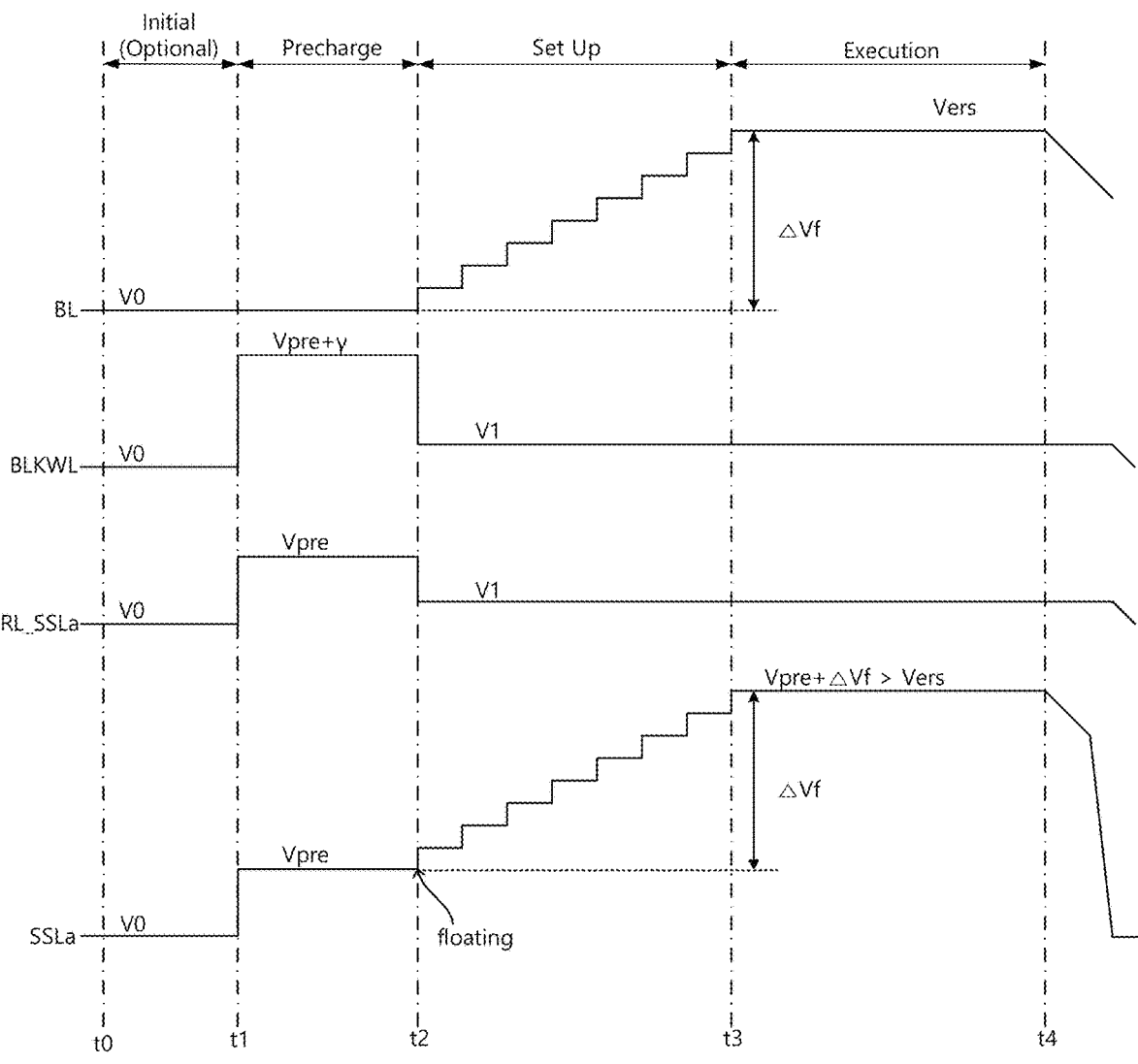
FIG. 10 is a timing diagram provided to describe a GIDL erase operation according to an example embodiment.

FIG. 10 is a timing diagram provided to describe a GIDL erase operation according to an example embodiment. For ease of description, a GIDL erase operation according to an example embodiment will be described with reference to FIG. 9. During a time period between t0 and t1, an initialization operation may be performed. For example, an initial voltage V0 may be provided to the bitline BL, the block wordline BLKWL, the string select row line RL_SSLa, and the string select line SSLa. The initial voltage V0 may be, for example, a ground voltage GND. Accordingly, the bitline BL, the block wordline BLKWL, the string select row line RL_SSLa, and the string select line SSLa may be discharged. However, this is merely exemplary, and the initial voltage V0 may have various voltage levels, such as a power supply voltage VDD, other than the ground voltage GND. In some embodiments, voltages having different levels may be applied, for example, the ground voltage GND may be applied to a portion of the bitline BL, the block wordline BLKWL, the string select row line RL_SSLa, and the string select line SSLa, and the power supply voltage VDD may be applied to another portion thereof. In some embodiments, the initialization operation may be skipped, and a following precharge operation may be immediately performed.

Next, in a time period between t1 and t2, a precharge operation may be performed. For example, the precharge voltage Vpre generated by the voltage generator 160 may be transmitted to the string select row line RL_SSLa. Since the voltage level of the block wordline BLKWL is Vpre+γ, which is higher than the level of the precharge voltage Vpre, the pass transistor PT_SSL may be turned on. Accordingly, the voltage level of the string select line SSLa may also be increased to the level of the precharge voltage Vpre.

Thereafter, at a point in time t2, the string select line SSLa may be floated. For example, as both the voltage level of the block wordline BLKWL and the voltage level of the string select row line RL_SSLa transition to the same level V1, the pass transistor PT_SSL may be turned off and the string select line SSLa may be floated.

Next, during a time period between t2 to t3, a set-up operation may be performed. For example, the erase voltage Vers provided through the bitline BL may be stepped up. In this case, a potential of a channel electrically connected to the bitline BL may also be stepped up. In addition, the voltage level of the string select line SSLa electrically coupled to the channel may also be stepped up. For example, a magnitude ΔVf of the increased erase voltage Vers and a magnitude ΔVf of the increased voltage level of the string select line SSLa may be the same.

In this case, a voltage level Vpre+ΔVf of the string select line SSLa may be stepped up while maintaining a potential difference with a voltage level V0+ΔVf of the erase voltage Vers by the precharge voltage Vpre. As a result, the string select transistor SST may be essentially bypassed to allow the erase voltage Vers, provided through the bitline BL, to be transmitted with very little voltage drop to the drain of the second GIDL transistor GDT2.

Then, during a period between t3 and t4, an execution operation may be performed. For example, the voltage level Vpre+ΔVf of the string select line SSLa may be maintained, and the voltage level V0+ΔVf of the erase voltage Vers provided through the bitline BL may be maintained. Accordingly, holes (+) may be moved to the charge storage layer 13b (see FIG. 5) adjacent to the fifth wordline WL5 on which an erase operation is to be performed.

As described above, the string select line SSLa may be precharged, so that the memory device 100A according to an example embodiment may generate a voltage of a string select line SSLa to have a high level without including an additional high-voltage generator. Accordingly, the string select transistor SST may be bypassed during the GIDL erase operation, allowing the GIDL erase operation to be stably and efficiently performed.

Figure 11:
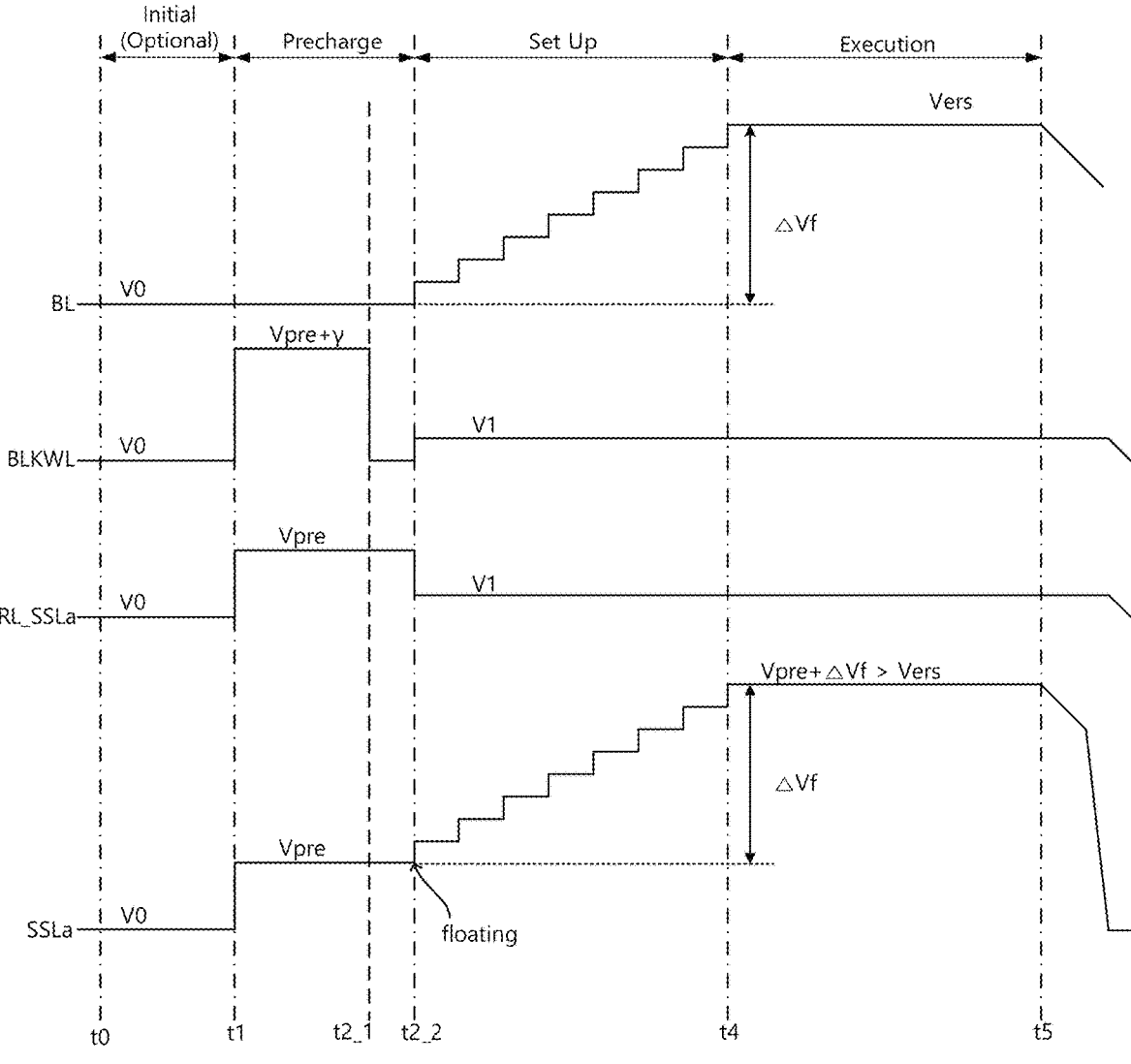
FIG. 11 is a timing diagram provided to describe a GIDL erase operation according to an example embodiment.
Figure 12A:
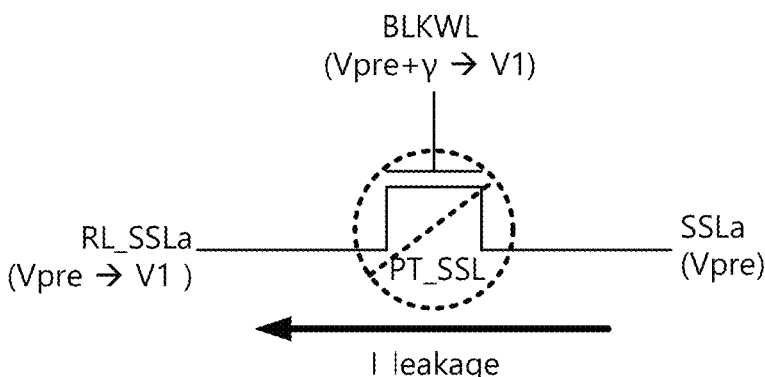
FIGS. 12A and 12B are diagrams illustrating an example of a voltage level of a pass transistor in a precharge period.
Figure 12B:
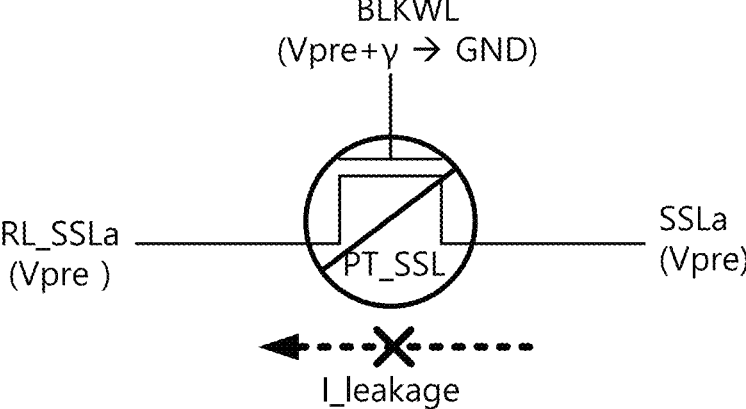

FIGS. 11 and 12 are diagrams provided to describe an example of an operation of a memory device according to an example embodiment, capable of preventing leakage current in a precharge period. For example, FIG. 11 is a timing diagram provided to describe a GIDL erase operation according to an example embodiment, and FIGS. 12A and 12B are diagrams illustrating an example of a voltage level of a pass transistor in a precharge period. A configuration and an operation of the memory device of FIGS. 11 and 12 are similar to those of the memory device of FIGS. 9 and 10. Therefore, the same or similar components will be denoted by the same or similar reference numerals, and repetitive descriptions will be omitted.

Referring to FIG. 11, in a time period between t1 and t2, a precharge operation may be performed. In this case, a voltage level of a block wordline BLKWL transitions to a low level before a voltage level of a string select row line RL_SSLa, so that a voltage drop of a string select line SSLa may be prevented from occurring due to leakage current in a precharge period.

For example, in a period between t1 and t2_1, the voltage level of the block wordline BLKWL may transition to a level Vpre+γ, which is higher than a voltage level of the precharge voltage Vpre, so that a pass transistor PT_SSL may be turned on. Accordingly, the precharge voltage Vpre of the string select row line RL_SSLa may be transmitted to the string select line SSLa, and the voltage level of the string select line SSLa may be increased to a voltage level of the precharge voltage Vpre.

At a point in time t2_1, the voltage level of the block wordline BLKWL may transition to a voltage level of an initial voltage V0. In this case, the string select row line RL_SSLa may be continuously maintained at the voltage of the precharge voltage Vpre by the voltage generator 160 of FIG. 9. For example, the voltage level of the string select row line RL_SSLa may be maintained at the voltage level of the precharge voltage Vpre until the pass transistor PT_SSL is completely turned off. At a point in time t2_2, both the voltage level of the block wordline BLKWL and the voltage level of the string select row line RL_SSLa may transition to the same voltage level V1.

As illustrated in FIG. 12A, when the voltage level of the string select row line RL_SSLa is decreased to the first voltage level V1 before the pass transistor PT_SSL is turned off, leakage current I_leakage may be generated in a direction toward the string select row line RL_SSLa from the string select line SSLa. Accordingly, the voltage level of the string select line SSLa may be decreased, and thus the string select transistor SST may be incompletely bypassed.

To prevent such leakage current, the voltage level of the string select row line RL_SSLa may be maintained at the voltage level of the precharge voltage Vpre for a predetermined time until the pass transistor PT_SSL is completely turned off. In this case, as illustrated in FIG. 12B, the generation of the leakage current I_leakage in the direction toward the string select row line RL_SSLa from the string select line SSLa may be blocked, and thus the voltage level of the string select line SSLa may be stably maintained at the voltage level of the precharge charge voltage Vpre.

Figure 13:
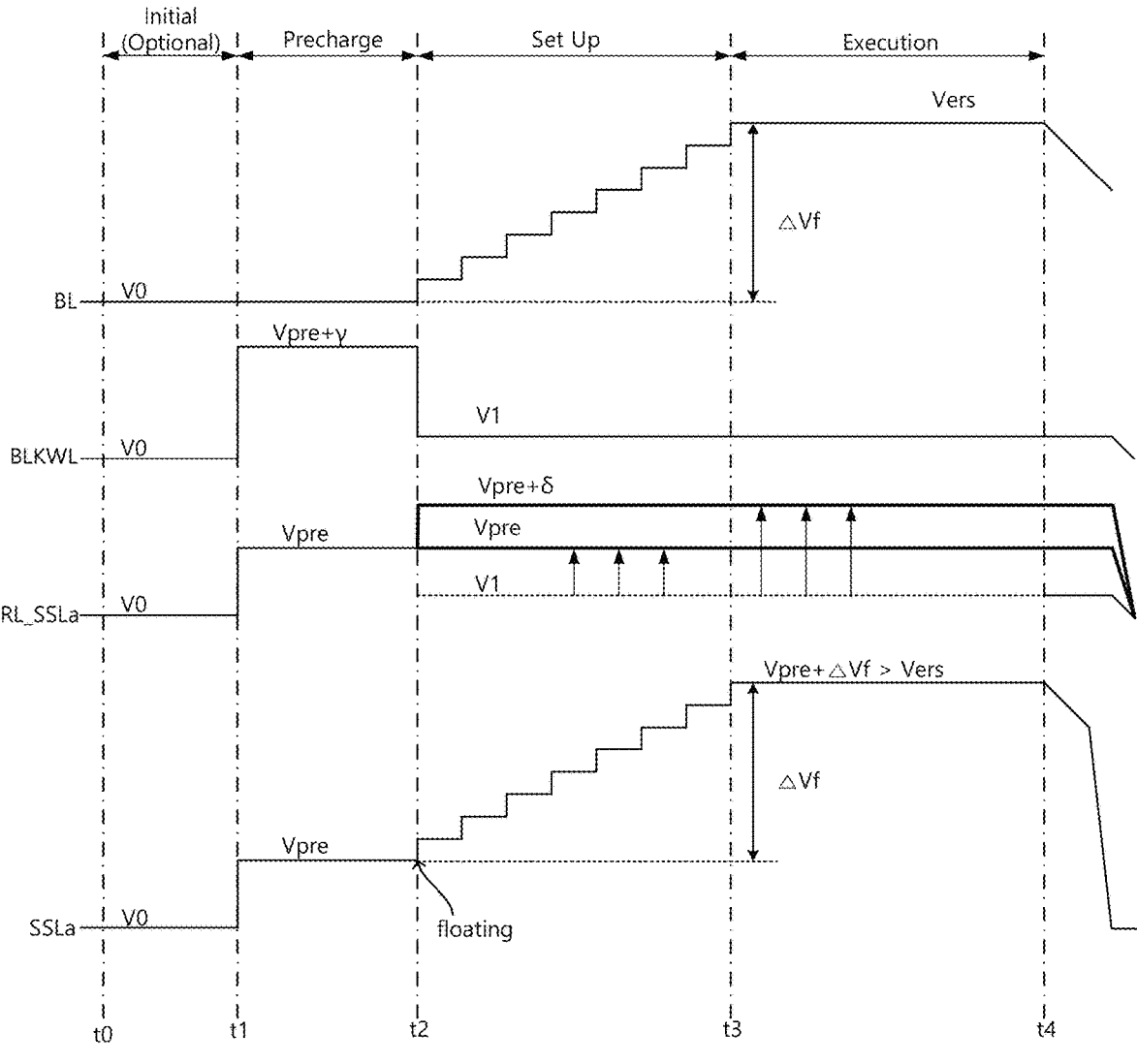
FIG. 13 is a timing diagram provided to describe a GIDL erase operation according to an example embodiment.
Figure 14A:
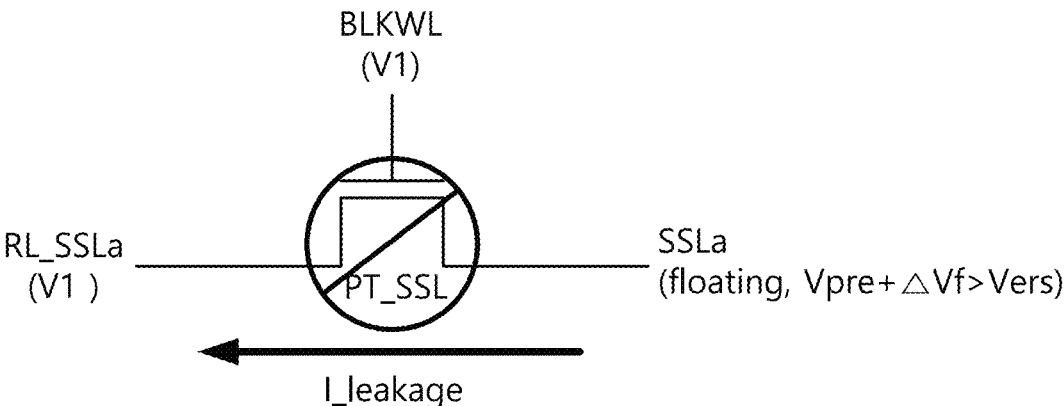
FIGS. 14A and 14B are diagrams illustrating examples of voltage levels of a pass transistor in a set-up period and an execution period.
Figure 14B:
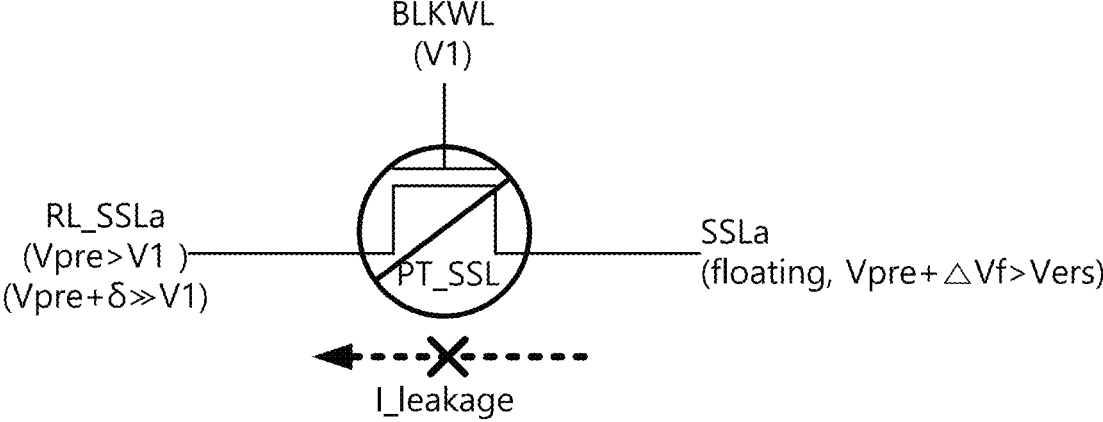
Figure 15:
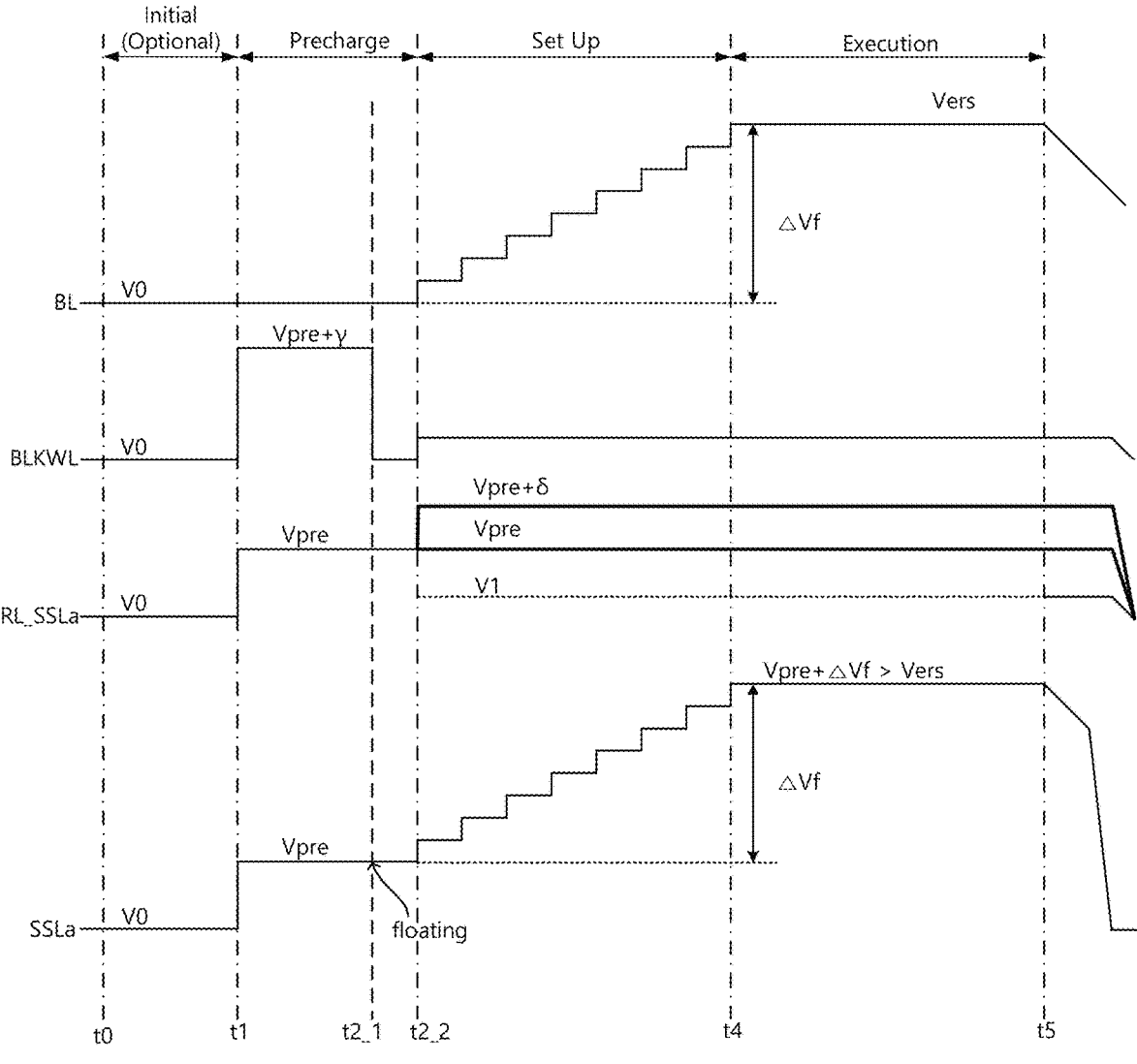
FIG. 15 is a diagram illustrating an example of an operation of a memory device according to an example embodiment, capable of preventing leakage current in a precharge period, a set-up period, and an execution period.
Figure 16:
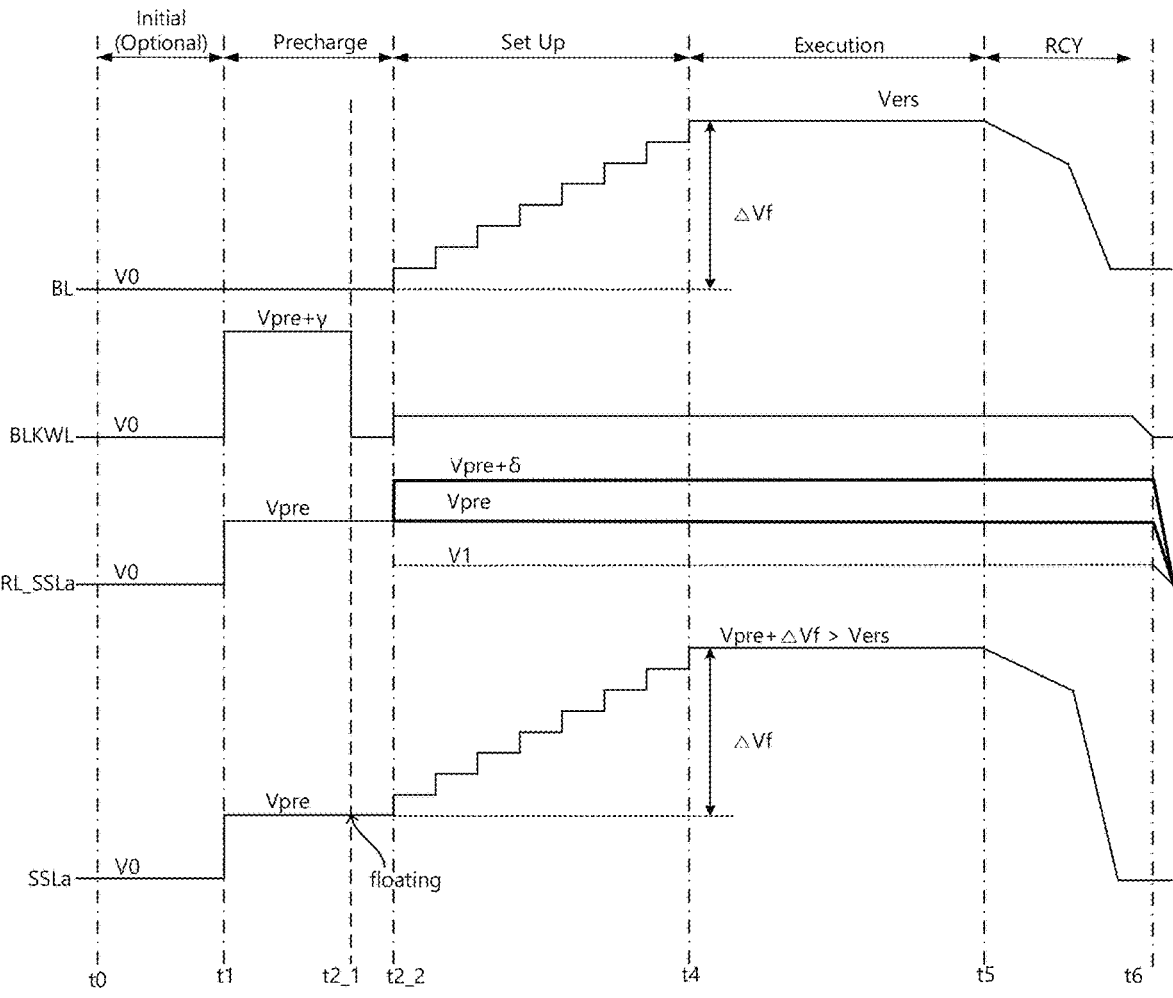
FIG. 16 is a timing diagram provided to describe a GIDL erase operation according to an example embodiment.

FIGS. 13 and 14 are diagrams provided to describe an example of an operation of a memory device according to an example embodiment, capable of preventing leakage current in a set-up period and an execution period. For example, FIG. 13 is a timing diagram provided to describe a GIDL erase operation according to an example embodiment, and FIGS. 14A and 14B are diagrams illustrating examples of voltage levels of a pass transistor PT_SSL in a set-up period and an execution period. A configuration and an operation of the memory device of FIGS. 15 and 16 are similar to those of the memory device of FIGS. 9 and 10. Therefore, the same or similar components will be denoted by the same or similar reference numerals, and repetitive descriptions will be omitted.

Referring to FIG. 13, in a period between t2 to t4, a set-up operation and an execution operation may be performed. In this case, a voltage level of a string select row line RL_SSLa may be set to be higher than a voltage level of a block wordline BLKWL. For example, as illustrated in FIG. 13, the voltage level of the string select row line RL_SSLa may be a voltage level of a precharge voltage Vpre or may be Vpre+δ, which is higher than the voltage level of the precharge voltage Vpre.

As illustrated in FIG. 14A, when the voltage level of the string select row line RL_SSLa is a first voltage level V1, a difference in voltages between a string select line SSLa and a string select row line RL_SSLa may be gradually increased as a voltage level of the string select line SSLa is stepped up. This may result in generation of leakage current I_leakage in a direction toward the string select row line RL_SSLa from the string select line SSLa. Accordingly, the voltage of the string select line SSLa may be decreased. As a result, the string select transistor SST may be incompletely bypassed.

To prevent such leakage current I_leakage, the voltage level of the string select row line RL_SSLa may be set to be higher than the voltage level of the block wordline BLKWL. In this case, as illustrated in FIG. 14B, the higher the voltage level of the string select row line RL_SSLa is than the voltage level of the block wordline BLKWL, the smaller the leakage current I_leakage flowing through the pass transistor PT_SSL. Accordingly, the voltage level of the string select line SSLa may be continuously maintained to be higher than the voltage level of the erase voltage Vers. As a result, the string select transistor SST may be more efficiently bypassed, which allows a GIDL erase operation to be more stably performed.

FIG. 15 is a diagram illustrating an example of an operation of a memory device according to an example embodiment, capable of preventing leakage current in a precharge period, a set-up period, and an execution period. Referring to FIG. 15, prior to a voltage level of a string select row line RL_SSLa, a voltage level of a block wordline BLKWL may transition to a low level during the precharge period. Accordingly, a voltage drop of the string select line SSLa may be prevented from occurring due to leakage current in the precharge period. In addition, the voltage level of the string select row line RL_SSLa may be maintained to be higher than the voltage level of the block wordline BLKWL, during the set-up period and the execution period. Accordingly, a voltage drop of the string select line SSLa may be prevented from occurring due to leakage current in the set-up period and the execution period. As a result, leakage current may be suppressed during the GIDL erase operation, allowing a GIDL erase operation to be more stably performed.

FIG. 16 is a timing diagram provided to describe a GIDL erase operation according to an example embodiment. For example, FIG. 16 illustrates an example embodiment in which leakage current in a recovery period may be prevented. A configuration and an operation of the memory device of FIG. 16 are similar to those of the memory device of FIGS. 9, 10, and 15. Therefore, the same or similar components will be denoted by the same or similar reference numerals, and repetitive descriptions will be omitted.

Referring to FIG. 16, in a period between t5 and t6, a set-up operation and an execution operation may be performed. In this case, a voltage level of a string select row line RL_SSLa may be maintained to be higher than a voltage level of the block wordline BLKWL until the voltage level of the block wordline BLKWL transitions to a voltage level of an initial voltage V0. Accordingly, leakage current in the recovery period may be prevented.

For example, when the voltage level of the string select row line RL_SSLa, prior to the voltage level of the block wordline BLKWL, transitions to the voltage level of the initial voltage V0 in the recovery period, the pass transistor PT_SSL may be slightly turned on to generate leakage current in a direction toward the string select row line RL_SSLa from the string select line SSLa. To prevent such leakage current, the voltage level of the string select row line RL_SSLa may be continuously maintained at a high level until the voltage level of the block wordline BLKWL transitions to the initial voltage V0. Accordingly, a recovery operation may be more stably performed.

Figure 17:
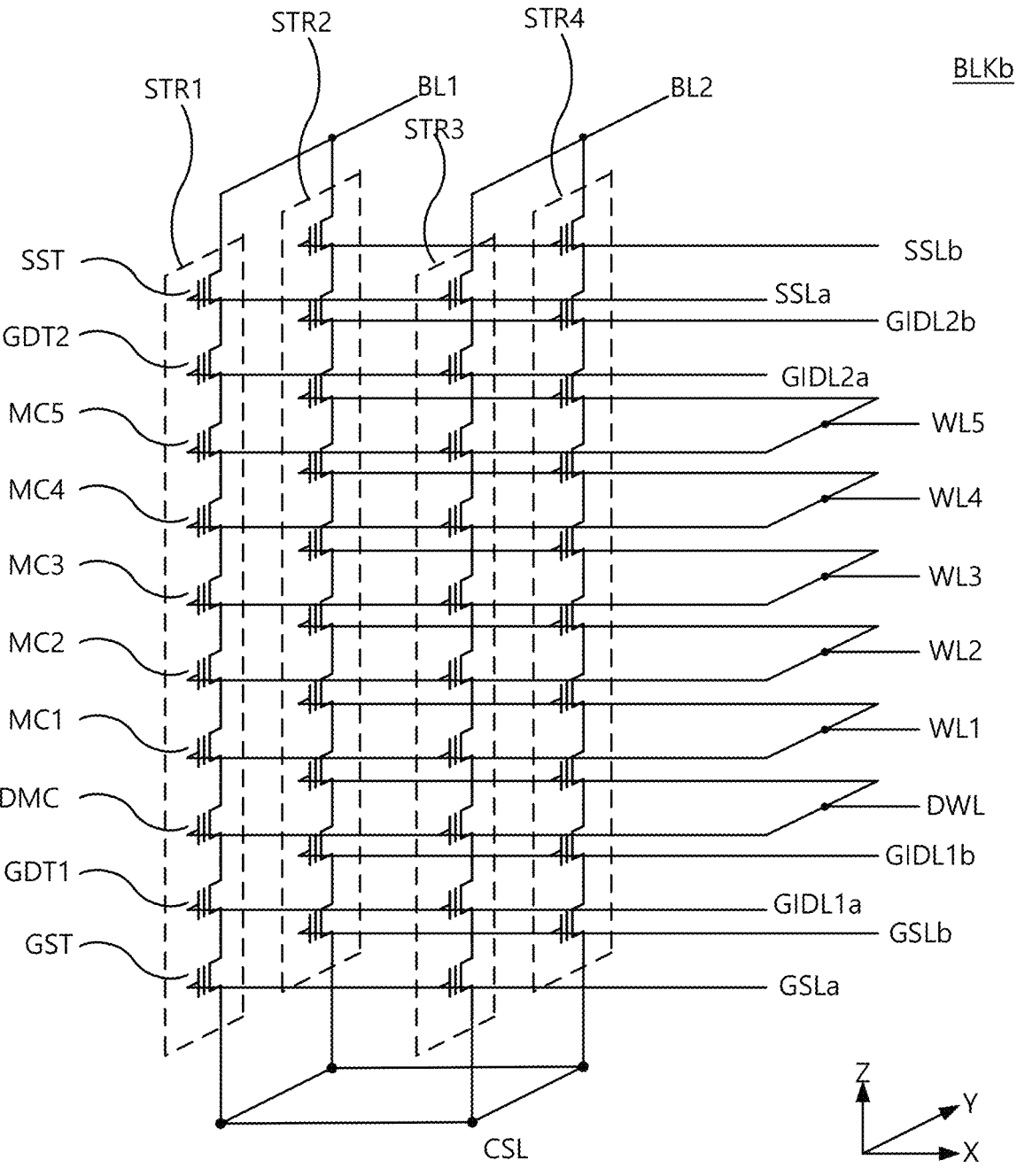
Figure 19:
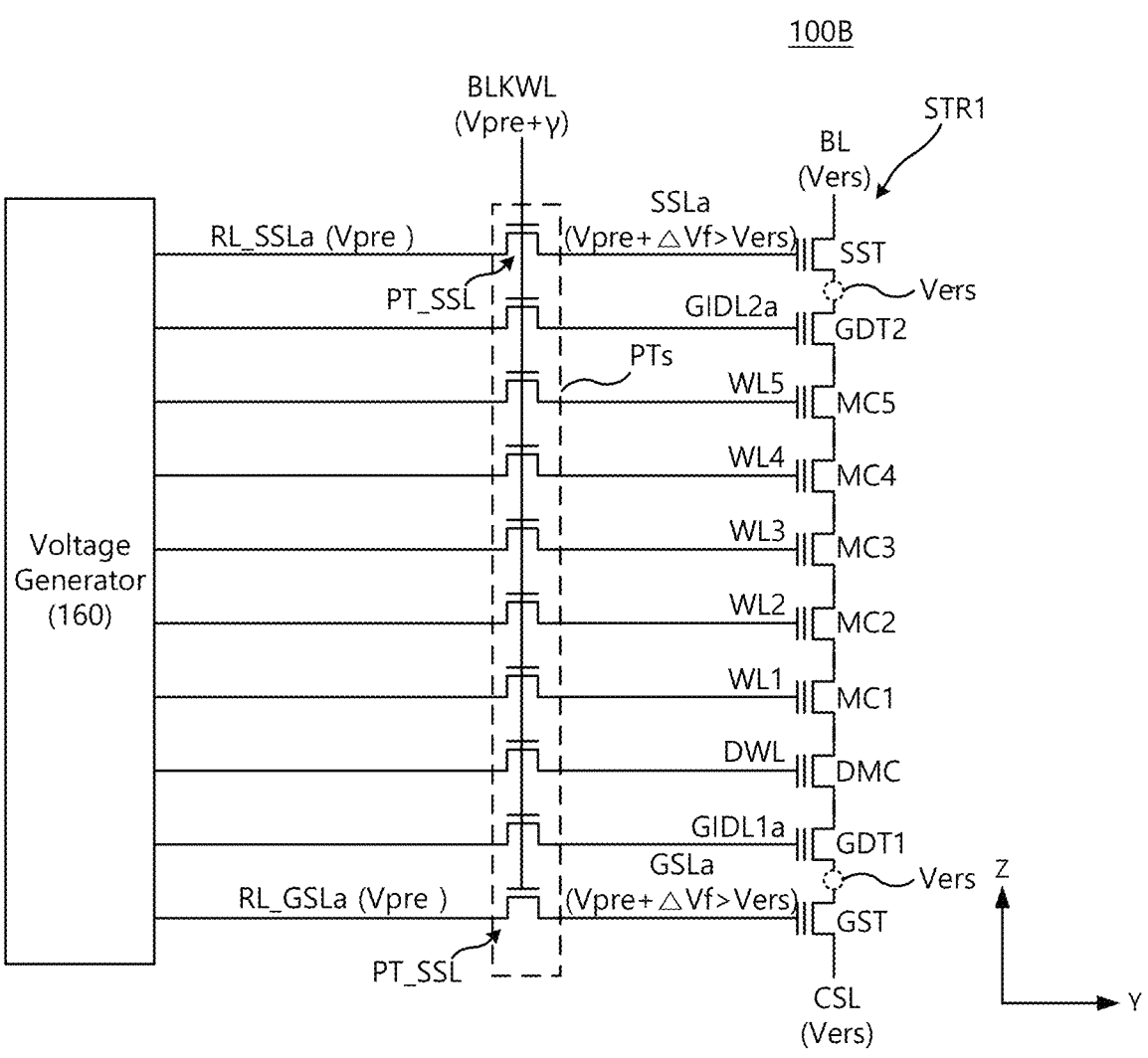

FIGS. 17 to 19 are diagrams provided to describe a memory device 100B according to an example embodiment. The memory device 100B of FIGS. 17 to 19 is similar to the memory device 100A of FIGS. 4 to 16. Accordingly, the same or similar components will be denoted by the same or similar reference numerals, and repetitive descriptions will be omitted.

It has been described in FIGS. 4 to 6 that, in the memory device 100A of FIGS. 4 to 16, a string select transistor SST is connected to a bitline BL and the string select transistor SST is bypassed during a GIDL erase operation. However, this is merely exemplary and example embodiments are not limited thereto. For example, as in the memory device 100B to be described below, a ground select transistor GST may be connected to a common source line CSL and the ground select transistor GST may be bypassed during a GIDL erase operation. Alternatively, a string select transistor SST may be connected to a bitline BL and the ground select transistor GST may be connected to the common source line CSL, and both the string select transistor SST and the ground select transistor GST may be bypassed during the GIDL erase operation.

For example, a ground select transistor GST may be disposed on a lowermost end of a string STR1, as illustrated in FIG. 17. For example, the ground select transistor GST may be disposed between a common source line CSL and a first GIDL transistor GDT1, and a ground select line GSLa may be connected to a gate of the ground select transistor GST.

An erase voltage Vers may be applied through the common source line CSL during a GIDL erase operation. In this case, a voltage level Vers+α, higher than a voltage level of the erase voltage Vers, may be provided to a ground select line GSLa, as illustrated in FIG. 18. Accordingly, the erase voltage Vers applied to the common source line CSL may bypass the ground select transistor GST and may be transmitted to a source of a first GIDL transistor GDT1.

The ground select line GSLa may be precharged to a precharge voltage to provide the voltage level Vers+α, higher than the voltage level of the erase voltage Vers, to the ground select line GSLa, as illustrated in FIG. 19. Then, as the ground select line GSLa is floated and a potential of a channel is stepped up, a voltage level of the ground select line GSLa may also be increased. Accordingly, the voltage level of the ground select line GSLa may be increased to Vpre+ΔVf, higher than the voltage level of the erase voltage Vers, and the erase voltage Vers provided through the common source line CSL may be transmitted to a source of the first GIDL transistor GDT1 by bypassing the ground select transistor GST. As a result, the ground select transistor GST may be bypassed, allowing the GIDL erase operation to be stably performed.

Figure 20:
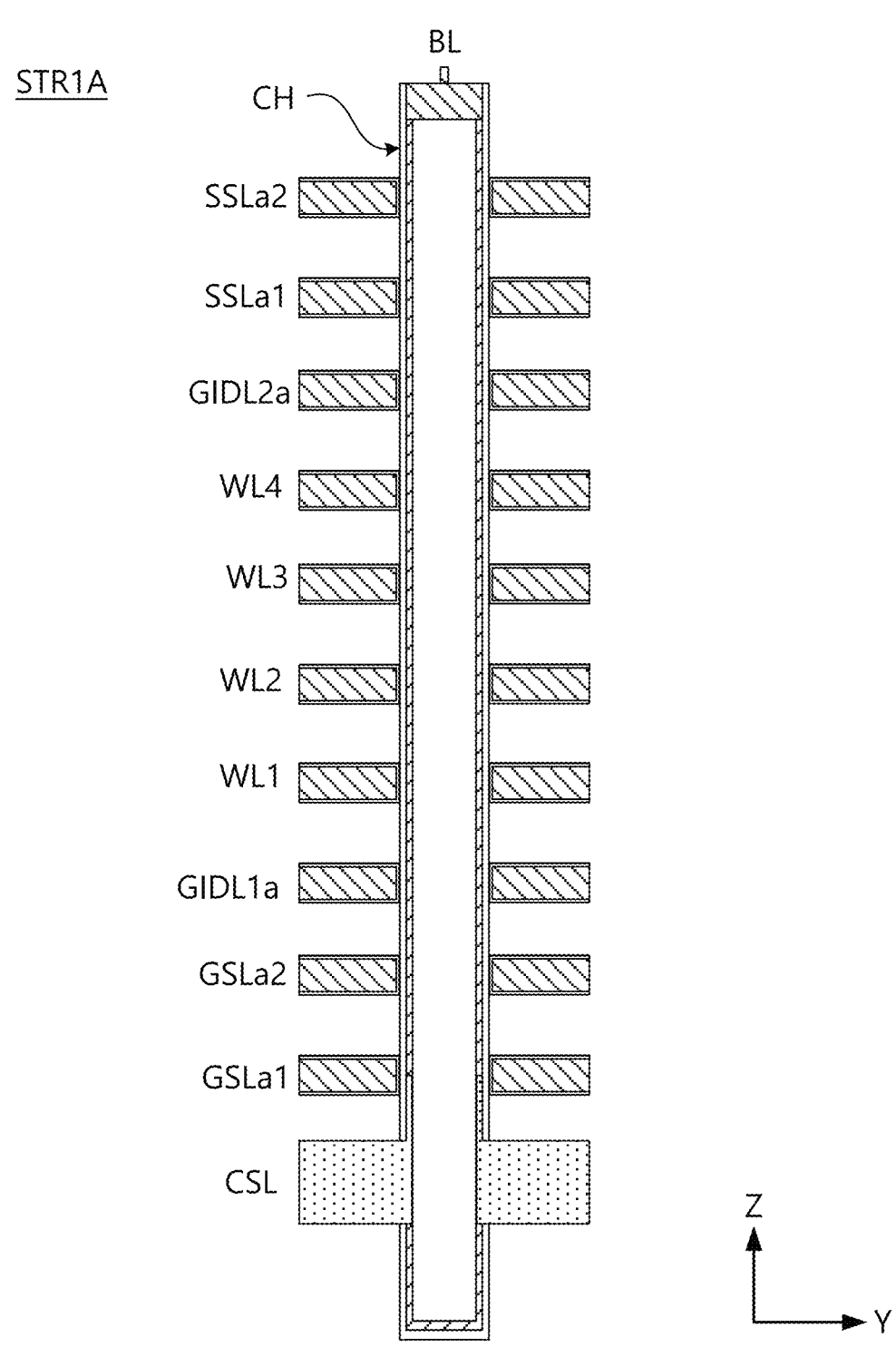
FIG. 20 is a diagram illustrating an example of a structure of a memory cell string of a memory device according to an example embodiment.

FIG. 20 is a diagram illustrating an example of a structure of a string of a memory device according to an example embodiment. A structure of the string STR1A of FIG. 20 is similar to that of the string of FIGS. 4 to 6. Accordingly, the same or similar components will be denoted by the same or similar reference numerals, and repetitive descriptions will be omitted.

In FIGS. 4 to 6, a string STR1 is illustrated as including a string select channel structure SCH and a channel structure CH. However, this is merely exemplary and example embodiments are not limited thereto. For example, as illustrated in FIG. 20, a string STR1A according to an example embodiment may not include a string select channel structure SCH. Also, the string STR1A according to an example embodiment may include a plurality of string select lines or a plurality of ground select lines.

For example, string select lines SSLa1 and SSLa2 may be stacked in a third direction (a Z-axis direction) and may be formed adjacent to the channel structure CH, as illustrated in FIG. 20. Similarly, ground select lines GSL1a and GSL2a may be stacked in the third direction (the Z-axis direction) and may be formed adjacent to the channel structure CH.

A voltage, higher than the erase voltage Vers, may be provided to the string select lines SSLa1 and SSLa2 or the ground select lines GSL1a and GSL2a. Accordingly, string select transistor corresponding to the string select lines SSLa1 and SSLa2 or ground string transistors corresponding to the ground select lines GSL1a and GSL2a may be bypassed, allowing the GIDL erase operation to be stably performed.

Figure 21:
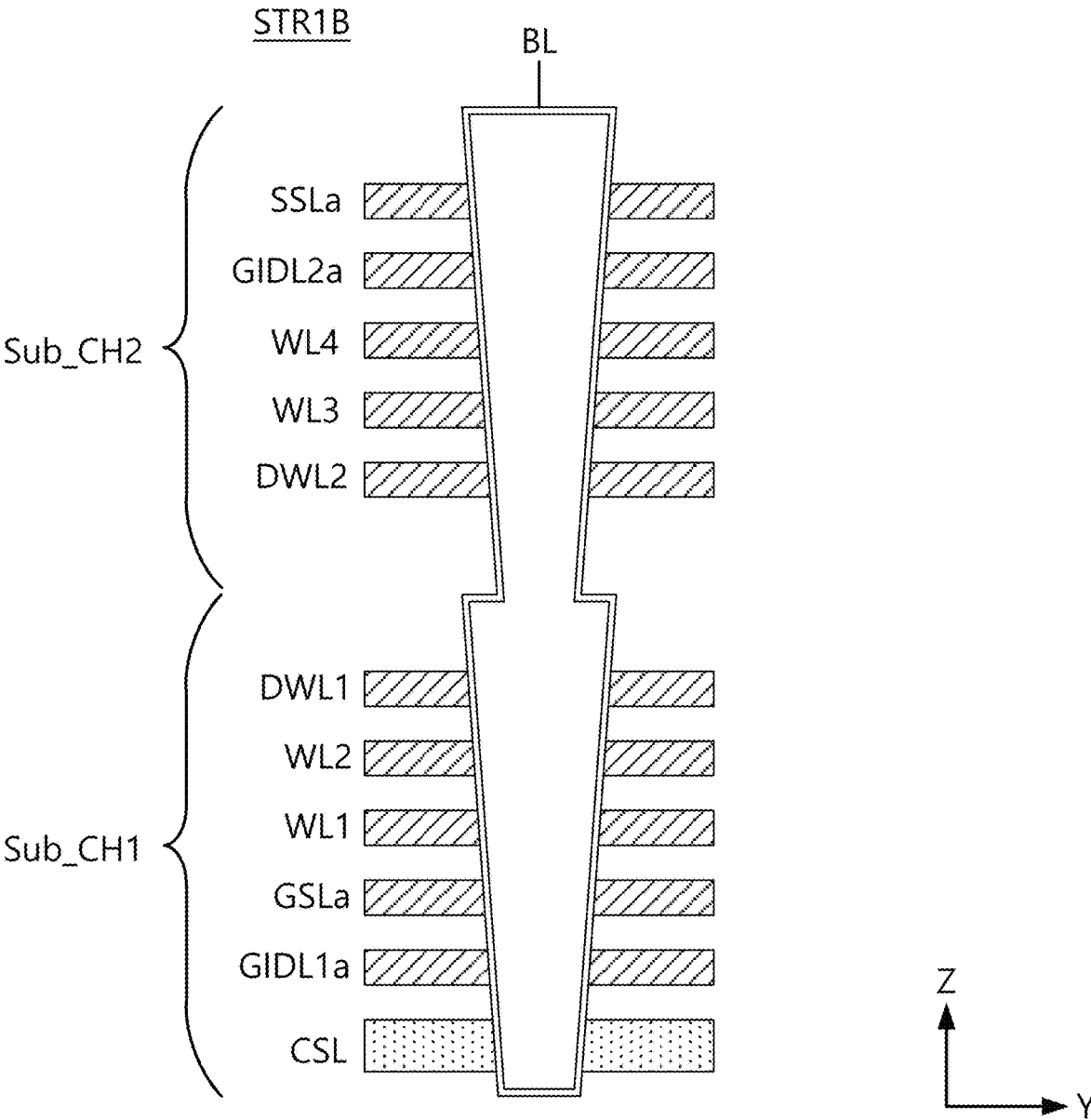
FIG. 21 is a diagram illustrating an example of a structure of a memory string of a memory device having a multi-stack structure according to an example embodiment.
Figure 22:
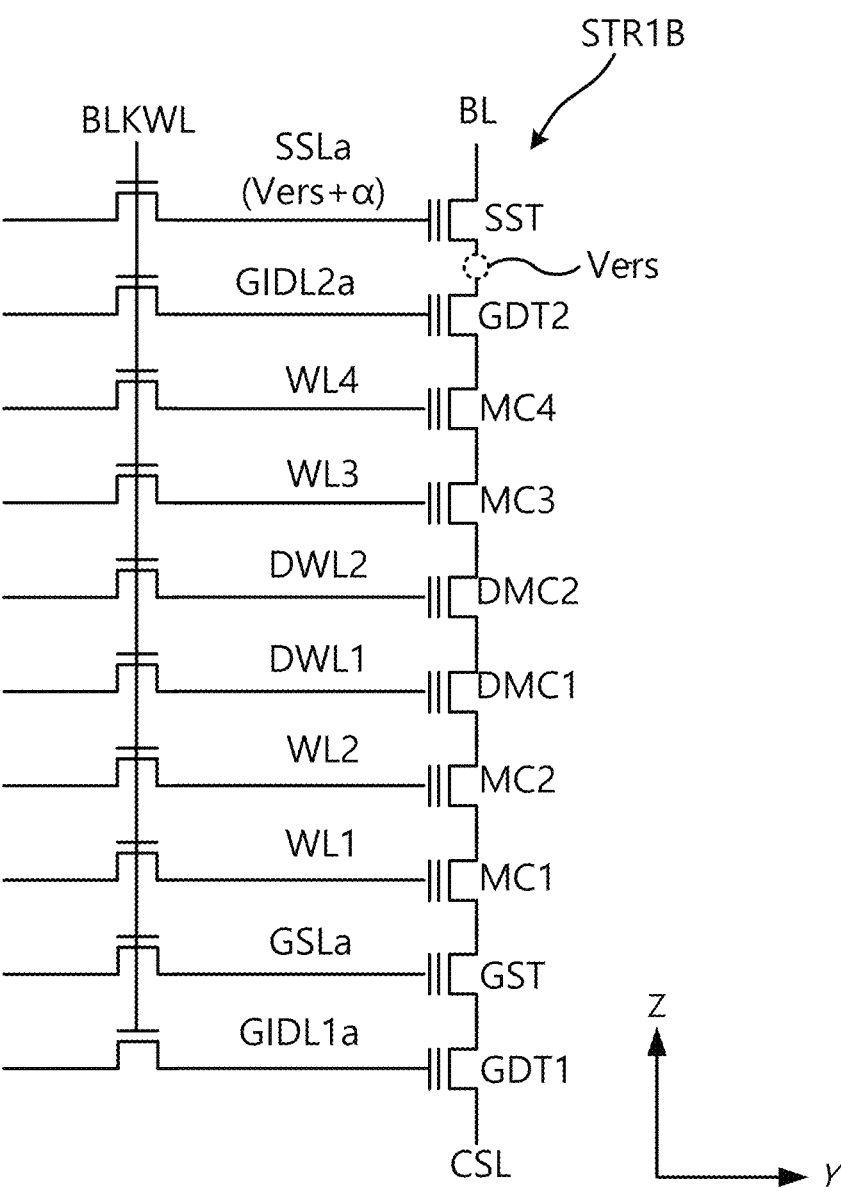
FIG. 22 is an equivalent circuit diagram of a memory cell string of FIG. 21.
Figure 23:
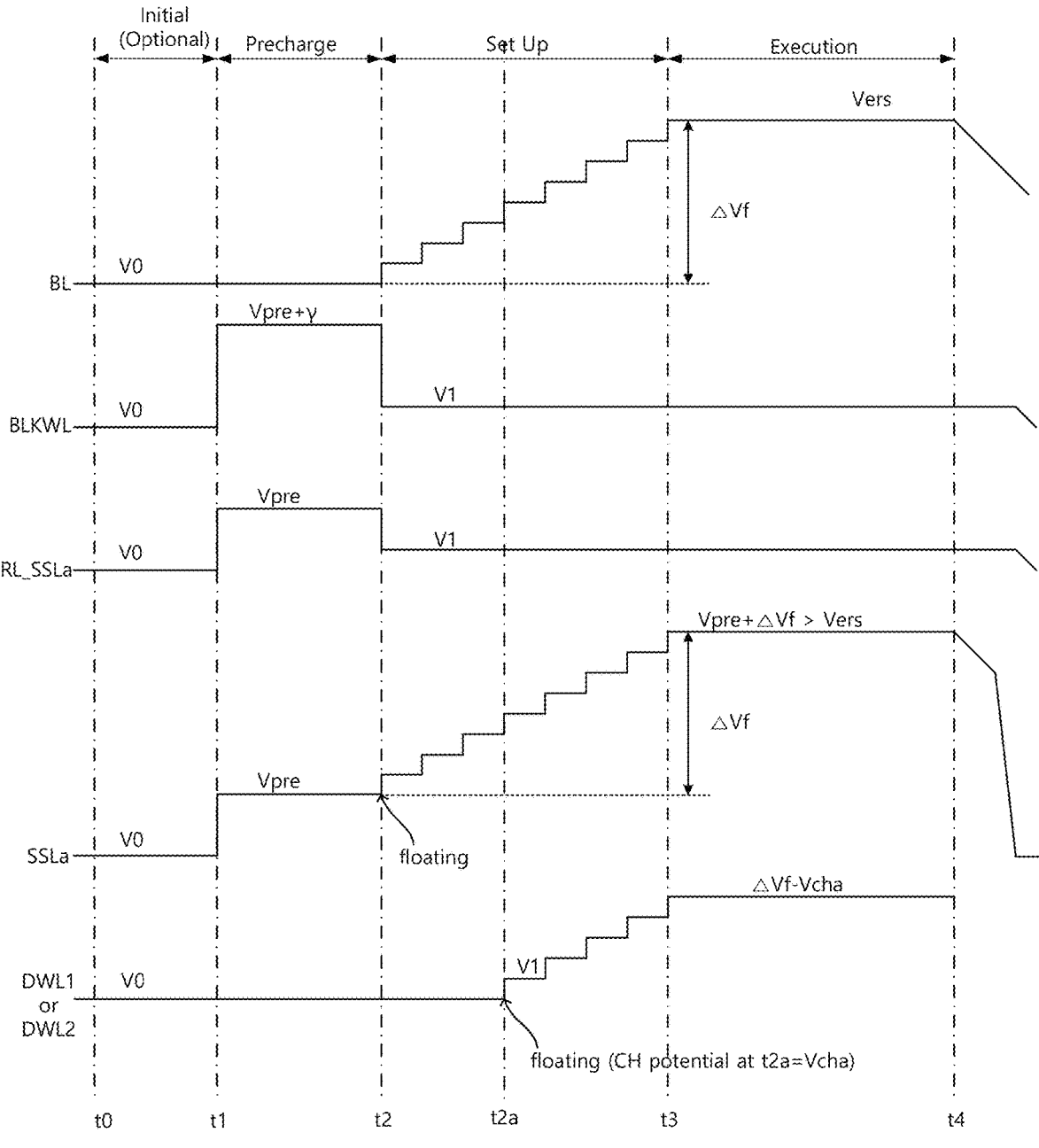
FIG. 23 is a timing diagram provided to describe a GIDL erase operation of the memory device of FIG. 21.

FIGS. 21 to 23 are diagrams provided to describe a structure and an operation of a string of a memory device according to an example embodiment. For example, FIG. 21 is a diagram illustrating an example of a structure of a string of a memory device having a multi-stacked structure according to an example embodiment, FIG. 22 is an equivalent circuit diagram of a string STR1B of FIG. 21, and FIG. 23 is a timing diagram provided to describe a GIDL erase operation of the memory device of FIG. 21. A configuration and an operation of the memory device of FIGS. 21 to 23 are similar to those of the memory device of FIGS. 5 to 10. Accordingly, the same or similar components will be denoted by the same or similar reference numerals, and repetitive descriptions will be omitted.

Referring to FIGS. 21 and 22, a memory device according to an example embodiment may have a multi-stacked structure. For example, a string STR1B may include a first sub-channel structure Sub_CH1 and a second sub-channel structure Sub_CH2. The second sub-channel structure Sub_CH2 may be stacked on the first sub-channel structure Sub_CH1. As an example, in the first sub-channel structure Sub_CH1, a common source line CSL, a first GIDL line GIDL1a, a ground select line GSLa, main wordlines WL1 and WL2, and a first dummy wordline DWL1 may be formed adjacent to each other. In the second sub-channel structure Sub_CH2A, second dummy wordline DWL2, main wordlines WL3 and WL4, a second GIDL line GIDL2a, and a string select line SSLa may be formed adjacent to each other.

Each of the first sub-channel structure Sub_CH1 and the second sub-channel structure Sub_CH2 may have a shape having a diameter decreased in a direction toward a substrate. For example, a diameter of a channel corresponding to the first dummy wordline DWL1 may be greater than a diameter of a channel corresponding to the second dummy wordline DWL2. Alternatively, a distance between the first and second dummy wordlines DWL1 and DWL2 may be greater than a distance between the other wordlines.

Due to such physical or structural characteristics, the dummy memory cells DMC1 and DMC2 connected to the first and second dummy wordlines DWL1 and DWL2 may not be used to store actual data, and may be set to have a specific threshold voltage. For example, a threshold voltage of first dummy memory cells DMC1 may be set by adjusting a point in time at which the first dummy wordline DWL1 is floated during a GIDL erase operation, and a threshold voltage of second dummy memory cells DMC2 may be set by adjusting a point in time at which the second dummy wordline DWL2 is floated during the GIDL erase operation.

For example, referring to FIG. 23, the first dummy wordline DWL1 may be floated at a point in time t2a. In this case, as a potential level of a channel is stepped up, a voltage level of the first dummy wordline DWL1 coupled to the channel may also be stepped up. Accordingly, a potential difference between the first dummy wordline DWL1 and the channel may be constantly maintained as a potential value (for example, Vcha) of the channel at a point in time t2a. Accordingly, the threshold voltage of the first dummy memory cell DMC1 may be set to have a specific value during the GIDL erase operation. Similarly, the threshold voltage of the second dummy memory cell DMC2 may also be set to have a specific value. In addition, a transistor connected to a bitline or a common source line is bypassed during a GIDL erase operation, allowing the GIDL erase operation to be stably performed on a string having a multi-stacked structure.

As described above, in a memory device according to example embodiments, a transistor provided with an erase voltage may be bypassed during a GIDL erase operation. As a result, the GIDL erase operation may be stably performed even in various structures.

While example embodiments have been shown and described above, it will be apparent to those skilled in the art that modifications and variations could be made without departing from the scope of the present inventive concept as defined by the appended claims.

What is claimed is:

1. A memory device, comprising:
a memory cell array having a plurality of memory blocks therein, including a target memory block;
a voltage generator configured to generate an erase voltage and row line voltages, which are provided to the target memory block upon which an erase operation is to be performed; and
control logic configured to control the memory cell array and the voltage generator;
wherein the erase voltage is provided to at least one of a bitline or a common source line associated with the target memory block; and
wherein a gate line of a transistor provided with the erase voltage is precharged before the erase voltage is provided to the at least one of the bitline or the common source line of the target memory block;
wherein the transistor is a string select transistor having a current carrying terminals electrically coupled to the bitline;
wherein the erase voltage is provided to a drain of the string select transistor through the bitline; and
wherein the erase voltage provided to the drain of the string select transistor is transferred to a source of the string select transistor.

2. The memory device of claim 1, wherein the gate line of the transistor is disposed in an electrically floating state subsequent to being precharged.

3. The memory device of claim 2, wherein the erase voltage is provided to the at least one of the bitline or the common source line associated with the target memory block while the gate line of the transistor is in the electrically floating state.

4. The memory device of claim 1, wherein the gate line, which is electrically connected to a gate of the string select transistor, includes polycrystalline silicon.

5. The memory device of claim 1, further comprising a ground select transistor connected to the common source line; wherein the erase voltage is further provided to a source of the ground select transistor through the common source line; and wherein the erase voltage is transferred to a drain of the ground select transistor.

6. The memory device of claim 1, wherein the target memory block comprises a plurality of memory cell strings; wherein at least one of the plurality of memory cell strings includes a channel structure and a string select channel structure disposed on the channel structure; and wherein the bitline is electrically connected to one end of the string select channel structure, and the gate line of the transistor is disposed at the same height as the string select channel structure.

7. The memory device of claim 6, wherein a portion of the string select channel structure overlaps the channel structure, and a center of the string select channel structure and a center of the channel structure do not match each other when viewed from a plan perspective.

8. The memory device of claim 6,
wherein the plurality of memory cell strings comprise:
    a first memory cell string including a first channel structure and a first string select channel structure disposed on the first channel structure; and
    a second memory cell string including a second channel structure and a second string select structure disposed on the second channel structure; and
    wherein a first string select line, which corresponds to the first string select channel structure, and a second string select line, which corresponds to the second string select channel structure, are physically separated from each other by a sub-separation region.

9. The memory device of claim 8, wherein the sub-separation region overlaps at least one wordline corresponding to the first channel structure and the second channel structure, when viewed from a plan perspective.

10. The memory device of claim 1, further comprising:
    a pass transistor extending in series between the voltage generator and the gate line of the transistor, said pass transistor configured to transfer a precharge voltage, which is generated by the voltage generator in response to a voltage level of a block wordline, to the gate line of the transistor; and
    wherein the precharge voltage provided to a drain of the pass transistor is maintained at a high level when the pass transistor is turned off.

11. The memory device of claim 10, wherein a level of a voltage provided to the drain of the pass transistor is higher than a level of a voltage provided to the block wordline while the erase voltage is being provided to the at least one of the bitline or the common source line.

12. An erase method of a memory device including a memory block having a plurality of memory cell strings formed in a direction perpendicular to a substrate, the method comprising:
    precharging a string select line connected to a gate of a string select transistor; then
    electrically floating the string select line; and then
    increasing a voltage at the gate of the string select transistor to be equal or greater than an erase voltage applied to a bitline after the string select line is electrically floated, wherein a voltage level of the electrically floated string select line is increased as the erase voltage is provided to a drain of the string select transistor through the bitline.

13. The erase method of claim 12,
wherein precharging the string select line comprises:
    providing a first voltage level to a gate of a pass transistor, extending between the string select line and a voltage generator, to thereby turn on the pass transistor; and
    providing a second voltage level, which is lower than the first voltage level, to a drain of the pass transistor through the voltage generator.

14. The erase method of claim 13,
wherein floating the string select line comprises:
    providing a third voltage level, lower than the second voltage level, to the gate of the pass transistor; and
    providing the third voltage level to the drain of the pass transistor.

15. The erase method of claim 14,
wherein precharging the string select line comprises:
    providing a fourth voltage level, lower than the third voltage level, to the gate of the pass transistor to turn off the pass transistor; and
    wherein a point in time at which the fourth voltage level is provided to the gate of the pass transistor is earlier than a point in time at which the third voltage level is provided to the drain of the pass transistor.

16. The erase method of claim 13,
wherein floating the string select line includes:
    providing a third voltage level, lower than the second voltage level, to the gate of the pass transistor; and
    providing a fourth voltage level, higher than the third voltage level, to the drain of the pass transistor.

17. A memory device, comprising:
a plurality of memory cell strings disposed on a substrate to be perpendicular to the substrate;
wherein at least one of the plurality of strings includes:
    a channel structure disposed on the substrate to be perpendicular to the substrate;
    a string select channel structure disposed on the channel structure;
    a select line disposed at the same height as the string select channel structure; and
    a plurality of row lines disposed adjacent to the channel structure;
wherein the memory device is configured such that an erase voltage is provided to an upper end of the string select channel structure through a bitline, and a select line is precharged to a predetermined voltage level before the erase voltage is provided;
wherein the string select channel structure comprises a string select transistor having a current carrying terminals electrically coupled to the bitline,
wherein the erase voltage is provided to a drain of the string select transistor through the bitline, and
wherein the erase voltage provided to the drain of the string select transistor is transferred to a source of the string select transistor.

18. The memory device of claim 17, wherein the select line is electrically floated after the erase voltage is precharged to the predetermined voltage.

19. The memory device of claim 18, wherein the erase voltage is provided to the at least one of the bitline while the select line is in electrically floated.

20. The memory device of claim 17, wherein the select line includes polycrystalline silicon.

* * * * *